(12) United States Patent
Chen et al.

(10) Patent No.: US 11,342,444 B2
(45) Date of Patent: May 24, 2022

(54) DIELECTRIC SPACER TO PREVENT CONTACTING SHORTING

(71) Applicant: Taiwan Semiconductor Manufacturing Company, Ltd., Hsinchu (TW)

(72) Inventors: Ting-Gang Chen, Taipei (TW); Tai-Chun Huang, Hsinchu (TW); Ming-Chang Wen, Kaohsiung (TW); Shu-Yuan Ku, Zhubei (TW); Fu-Kai Yang, Hsinchu (TW); Tze-Liang Lee, Hsinchu (TW); Yung-Cheng Lu, Hsinchu (TW); Yi-Ting Fu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/576,436

(22) Filed: Sep. 19, 2019

(65) Prior Publication Data
US 2020/0013875 A1 Jan. 9, 2020

Related U.S. Application Data

(62) Division of application No. 16/016,935, filed on Jun. 25, 2018, now Pat. No. 11,107,902.

(51) Int. Cl.
*H01L 29/66* (2006.01)
*H01L 29/78* (2006.01)
(Continued)

(52) U.S. Cl.
CPC .. *H01L 29/66545* (2013.01); *H01L 21/31116* (2013.01); *H01L 21/76224* (2013.01);
(Continued)

(58) Field of Classification Search
CPC ............. H01L 29/785; H01L 29/66795; H01L 21/76897; H01L 21/76224;
(Continued)

(56) References Cited

U.S. PATENT DOCUMENTS 6,184,129 B1   2/2001  Hwang et al.
6,348,709 B1   2/2002  Graettinger et al.
(Continued)

*Primary Examiner* — Allen L Parker
*Assistant Examiner* — Gustavo G Ramallo
(74) *Attorney, Agent, or Firm* — Slater Matsil, LLP

(57) ABSTRACT

A method includes forming a first and a second dummy gate stack crossing over a semiconductor region, forming an ILD to embed the first and the second dummy gate stacks therein, replacing the first and the second dummy gate stacks with a first and a second replacement gate stack, respectively, performing a first etching process to form a first opening. A portion of the first replacement gate stack and a portion of the second replacement gate stack are removed. The method further includes filling the first opening to form a dielectric isolation region, performing a second etching process to form a second opening, with the ILD being etched, and the dielectric isolation region being exposed to the second opening, forming a contact spacer in the second opening, and filling a contact plug in the second opening. The contact plug is between opposite portions of the contact spacer.

20 Claims, 33 Drawing Sheets

(51) Int. Cl.
*H01L 21/768* (2006.01)
*H01L 21/762* (2006.01)
*H01L 27/092* (2006.01)
*H01L 21/8238* (2006.01)
*H01L 21/311* (2006.01)

(52) U.S. Cl.
CPC .. *H01L 21/76816* (2013.01); *H01L 21/76897* (2013.01); *H01L 21/823821* (2013.01); *H01L 27/0924* (2013.01); *H01L 29/66795* (2013.01); *H01L 29/785* (2013.01)

(58) Field of Classification Search
CPC ......... H01L 21/76816; H01L 21/76843; H01L 21/76831; H01L 21/823821; H01L 27/0886; H01L 27/0924; H01L 29/66545
See application file for complete search history.

(56) References Cited

U.S. PATENT DOCUMENTS

| | | | |
|---|---|---|---|
| 7,932,146 B2 | 4/2011 | Chen et al. | |
| 8,404,544 B1 | 3/2013 | Yin et al. | |
| 8,436,404 B2 | 5/2013 | Bohr et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,472,418 B2 | 10/2016 | Hall et al. | |
| 9,520,482 B1 | 12/2016 | Chang et al. | |
| 9,553,088 B1 | 1/2017 | Basker et al. | |
| 9,576,814 B2 | 2/2017 | Wu et al. | |
| 9,852,947 B1 * | 12/2017 | Ko | H01L 21/0337 |
| 10,062,784 B1 * | 8/2018 | Lee | H01L 21/3105 |
| 10,312,150 B1 | 6/2019 | Al-Amoody et al. | |
| 2002/0132403 A1 | 9/2002 | Hung et al. | |
| 2009/0039433 A1 | 2/2009 | Fang et al. | |
| 2010/0117164 A1 | 5/2010 | Lin et al. | |
| 2010/0237424 A1 | 9/2010 | Cheng et al. | |
| 2011/0156107 A1 * | 6/2011 | Bohr | H01L 21/76849 257/288 |
| 2011/0300693 A1 | 12/2011 | Oh | |
| 2012/0244675 A1 | 9/2012 | Wu et al. | |
| 2013/0059434 A1 | 3/2013 | Fang et al. | |
| 2013/0181293 A1 | 7/2013 | Gambino et al. | |
| 2015/0054078 A1 * | 2/2015 | Xie | H01L 27/1211 257/347 |
| 2015/0279975 A1 * | 10/2015 | Hsiao | H01L 29/7853 257/401 |
| 2015/0325482 A1 | 11/2015 | Hu et al. | |
| 2015/0348965 A1 | 12/2015 | Chang et al. | |
| 2016/0049422 A1 | 2/2016 | Kim et al. | |
| 2016/0133632 A1 | 5/2016 | Park et al. | |
| 2016/0181425 A1 | 6/2016 | Bai et al. | |
| 2017/0005000 A1 | 1/2017 | Beyne | |
| 2017/0062031 A1 | 3/2017 | Han | |
| 2018/0033866 A1 | 2/2018 | Liao et al. | |
| 2018/0069000 A1 | 3/2018 | Bergendahl et al. | |
| 2018/0174904 A1 | 6/2018 | Hsieh et al. | |
| 2018/0197970 A1 | 7/2018 | Pan et al. | |
| 2018/0337188 A1 * | 11/2018 | Yu | H01L 21/30604 |
| 2018/0342420 A1 | 11/2018 | You et al. | |
| 2019/0131171 A1 * | 5/2019 | Gwak | H01L 23/528 |

\* cited by examiner

US 11,342,444 B2

DIELECTRIC SPACER TO PREVENT CONTACTING SHORTING

PRIORITY CLAIM AND CROSS-REFERENCE

This application is a divisional of U.S. patent application Ser. No. 16/016,935, entitled "Dielectric Spacer to Prevent Contacting Shorting," filed on Jun. 25, 2018, which application is incorporated herein by reference.

BACKGROUND

Metal-Oxide-Semiconductor (MOS) devices are basic building elements in integrated circuits. An existing MOS device typically has a gate electrode having polysilicon doped with p-type or n-type impurities, using doping operations such as ion implantation or thermal diffusion. The work function of the gate electrode was adjusted to the band-edge of the silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also referred to as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes or metal silicide gate electrodes, wherein the metallic gates used in NMOS devices and PMOS devices may also have band-edge work functions. Since the NMOS devices and PMOS devices have different requirements regarding the work functions, dual-gate CMOS devices are used.

In the formation of the metal gate electrodes, a long dummy gate is formed first, which is then etched, so that the portions of the long dummy gate are separated from each other. A dielectric material is then filled into the opening left by the etched portion of the long dummy gate. The dielectric material is then polished, leaving a portion of the dielectric material between the remaining portions of the dummy gate. The separated portions of the dummy gate are then replaced with metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
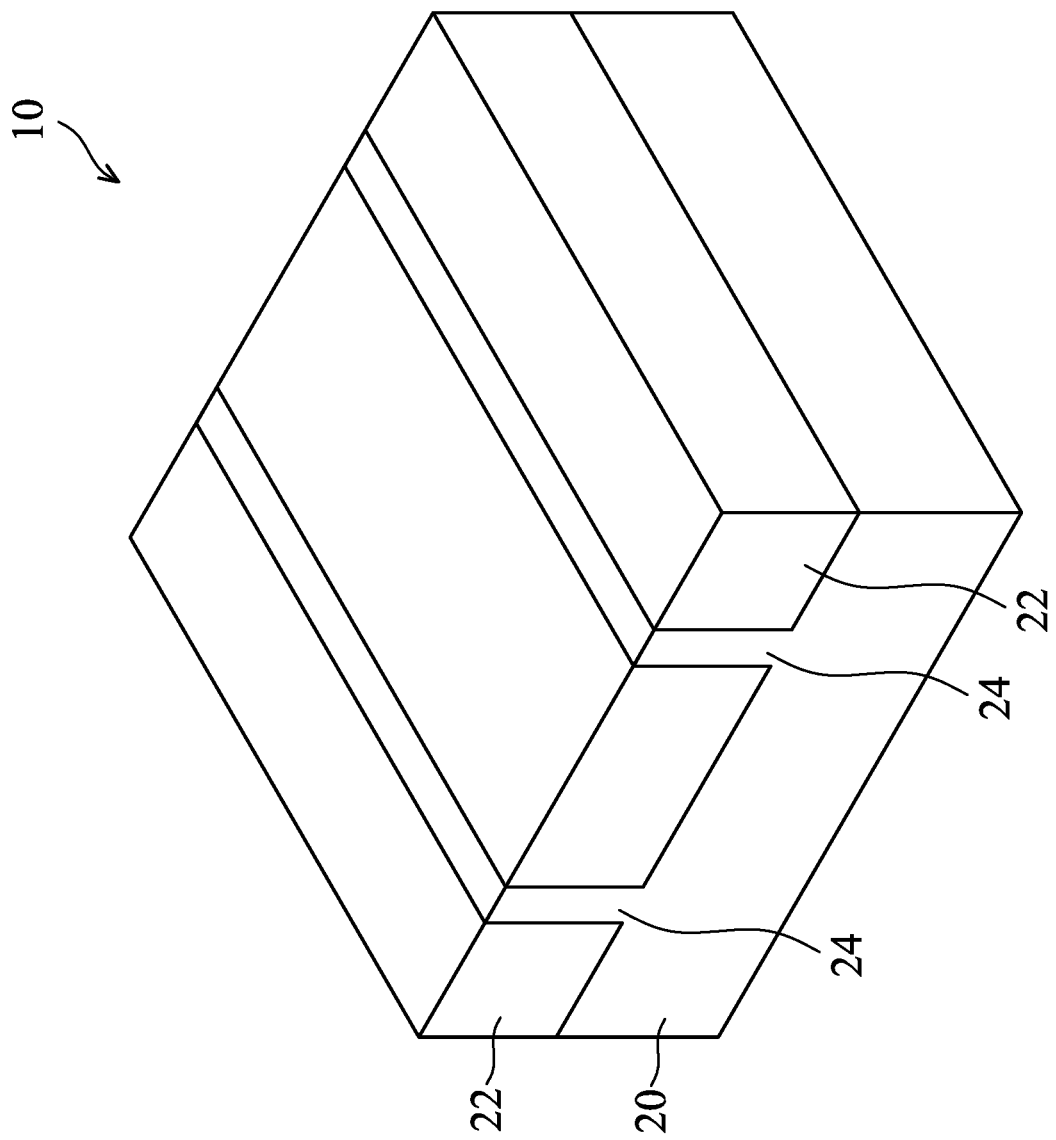
FIGS. 1-4, 5A, 5B, 6A, 6B, 7A, 7B, 8A, 8B, 8C, 9A, 9B, 9C, 9D, 10A, 10B, 10C, 11A, 11B, 11C, 12A, 12B, 12C, 13A, 13B, 14A, 14B, 14C and 15 illustrate the perspective views, top views, and cross-sectional views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors formed using cut-metal-gate processes and the methods of forming the same are provided in accordance with various embodiments. The intermediate stages of forming the transistors are illustrated in accordance with some embodiments. Some variations of some embodiments are discussed. Throughout the various views and illustrative embodiments, like reference numbers are used to designate like elements. In the illustrated embodiments, the formation of Fin Field-Effect Transistors (FinFETs) is used as an example to explain the concept of the present disclosure. The formation of the metal gates of planar transistors may also adopt the embodiments of the present disclosure.

FIGS. 1 through 15 illustrate the cross-sectional views, top views, and perspective views of intermediate stages in the formation of FinFETs adopting cut-metal-gate processes in accordance with some embodiments of the present disclosure. The processes shown in FIGS. 1 through 15 are also reflected schematically in the process flow as shown in FIG. 16.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions are formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some embodiments. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy process to regrow another semiconductor material in the recesses. Accordingly, semiconductor strips 24 are formed of a semiconductor material different from that of substrate 20. In accordance with some embodiments of the present disclosure, semiconductor strips 24 are formed of silicon germanium, silicon carbon, or a III-V compound semiconductor material.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), Chemical Vapor Deposition (CVD), or the like. STI regions 22 may also include a dielectric material over the liner oxide, wherein the dielectric material may be formed using Flowable Chemical Vapor Deposition (FCVD), spin-on, or the like.

Figure 2:
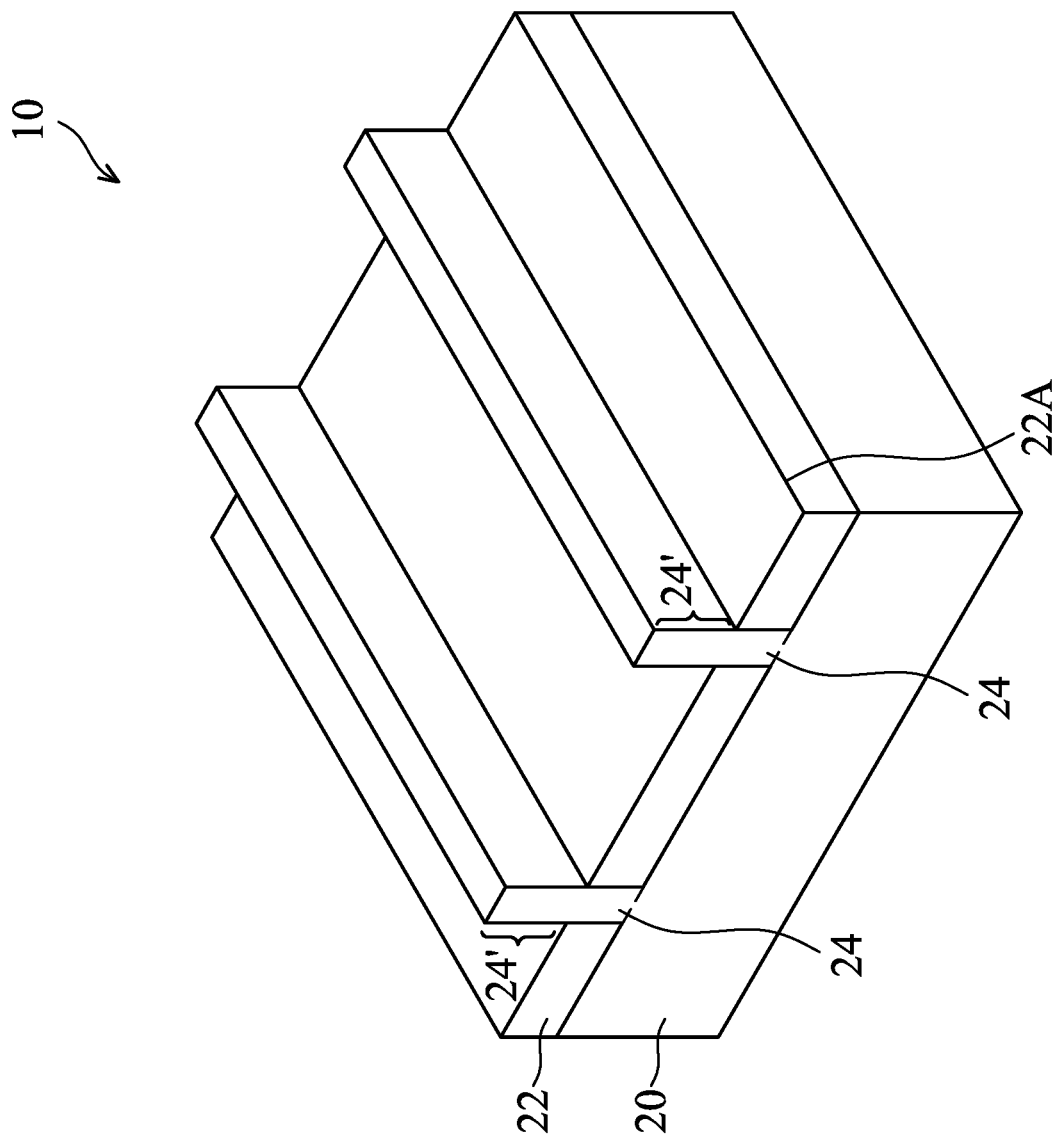

Referring to FIG. 2, STI regions 22 are recessed, so that the top portions of semiconductor strips 24 protrude higher than the top surfaces 22A of the remaining portions of STI regions 22 to form protruding fins 24'. The respective process is illustrated as process 202 in the process flow as shown in FIG. 16. The etching may be performed using a dry etching process, wherein $HF_3$ and $NH_3$ are used as the etching gases. In accordance with alternative embodiments of the present disclosure, the recessing of STI regions 22 is performed using a wet etch process. The etching chemical may include HF solution, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The materials of protruding fins 24' may be the same as or different from that of substrate 20. For example, protruding fins 24' may be formed of Si, SiP, SiC, SiPC, SiGe, SiGeB, Ge, or a III-V compound semiconductor such as InP, GaAs, AlAs, InAs, InAlAs, InGaAs, or the like.

Figure 3:
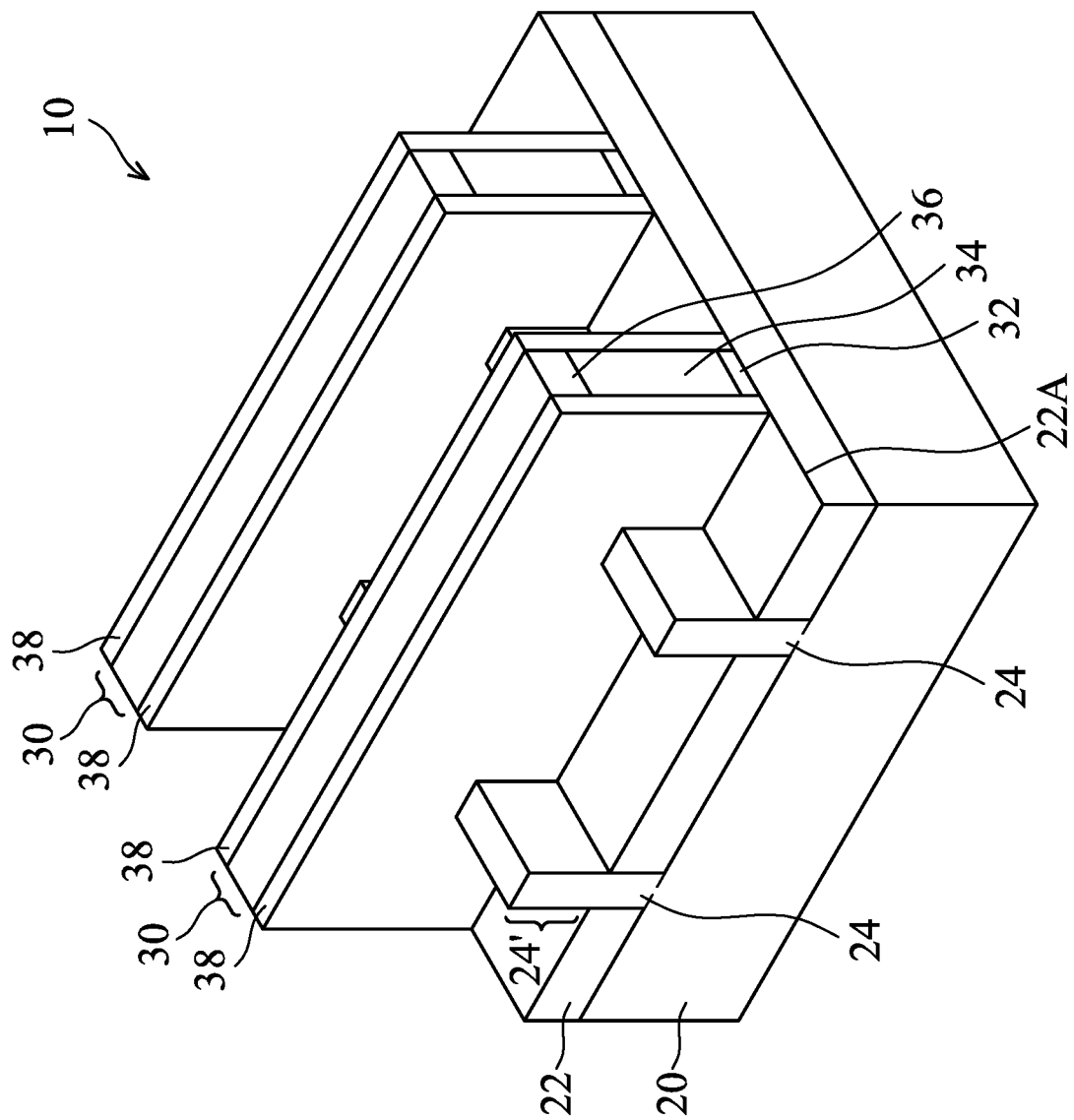

Referring to FIG. 3, dummy gate stacks 30 are formed on the top surfaces and the sidewalls of (protruding) fins 24'. The respective process is illustrated as process 204 in the process flow as shown in FIG. 16. Dummy gate stacks 30 may include dummy gate dielectrics 32 and dummy gate electrodes 34 over dummy gate dielectrics 32. Dummy gate electrodes 34 may be formed, for example, using polysilicon, and other materials may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, or multi-layers thereof, or the like. Dummy gate stacks 30 may cross over a single one or a plurality of protruding fins 24' and/or STI regions 22. Dummy gate stacks 30 also have lengthwise directions perpendicular to the lengthwise directions of protruding fins 24'.

Next, gate spacers 38 are formed on the sidewalls of dummy gate stacks 30. In accordance with some embodiments of the present disclosure, gate spacers 38 are formed of a dielectric material such as silicon nitride, silicon oxide, silicon carbo-nitride, silicon oxynitride, silicon oxy carbo-nitride, or the like, and may have a single-layer structure or a multi-layer structure including a plurality of dielectric layers.

Figure 4:
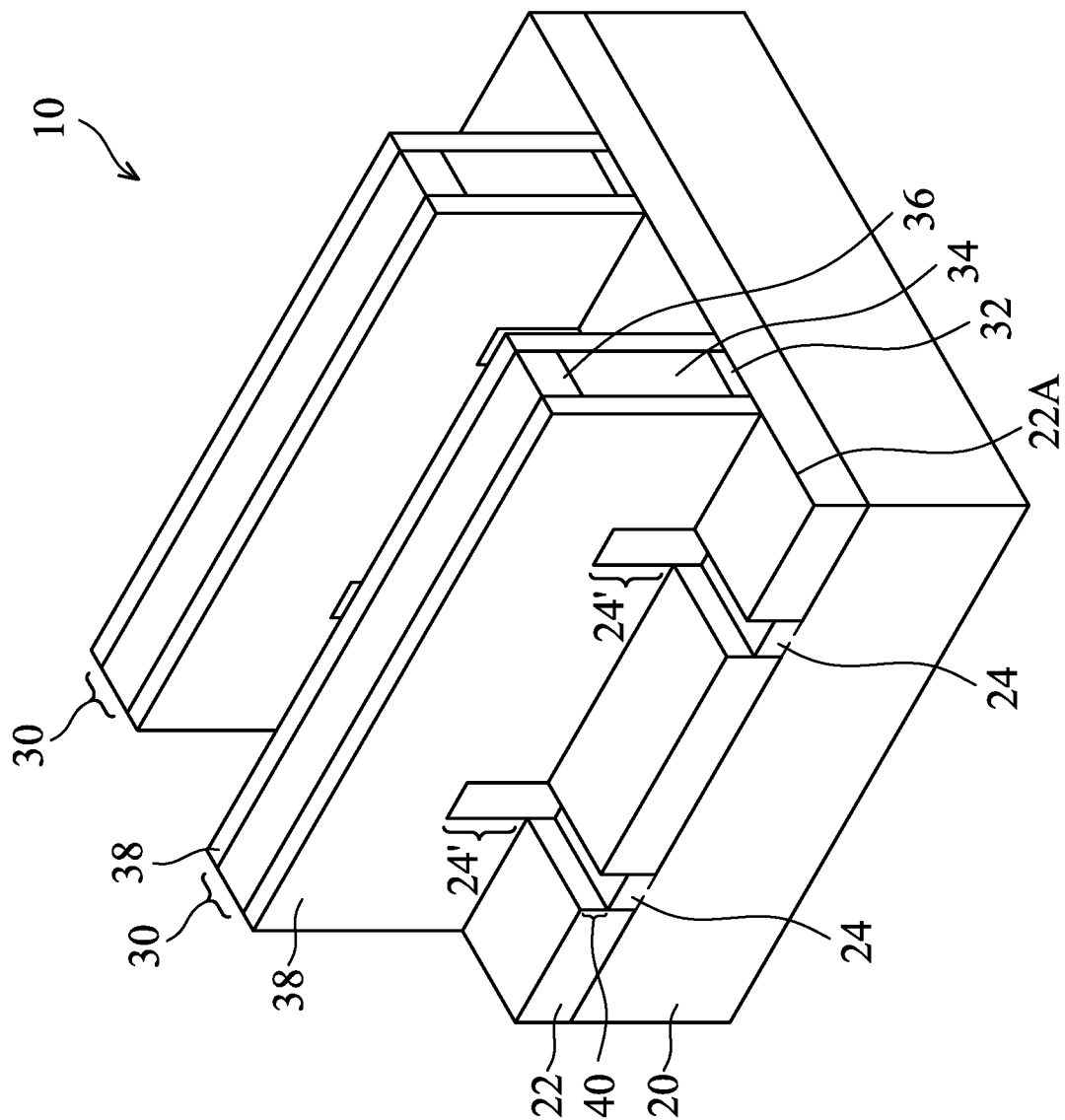

In accordance with some embodiments of the present disclosure, an etching step (referred to as fin recessing hereinafter) is performed to etch the portions of protruding fins 24' that are not covered by dummy gate stack 30 and gate spacers 38, resulting in the structure shown in FIG. 4. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. Recesses 40 are accordingly formed between STI regions 22. Recesses 40 are located on the opposite sides of dummy gate stacks 30.

Figure 5A:
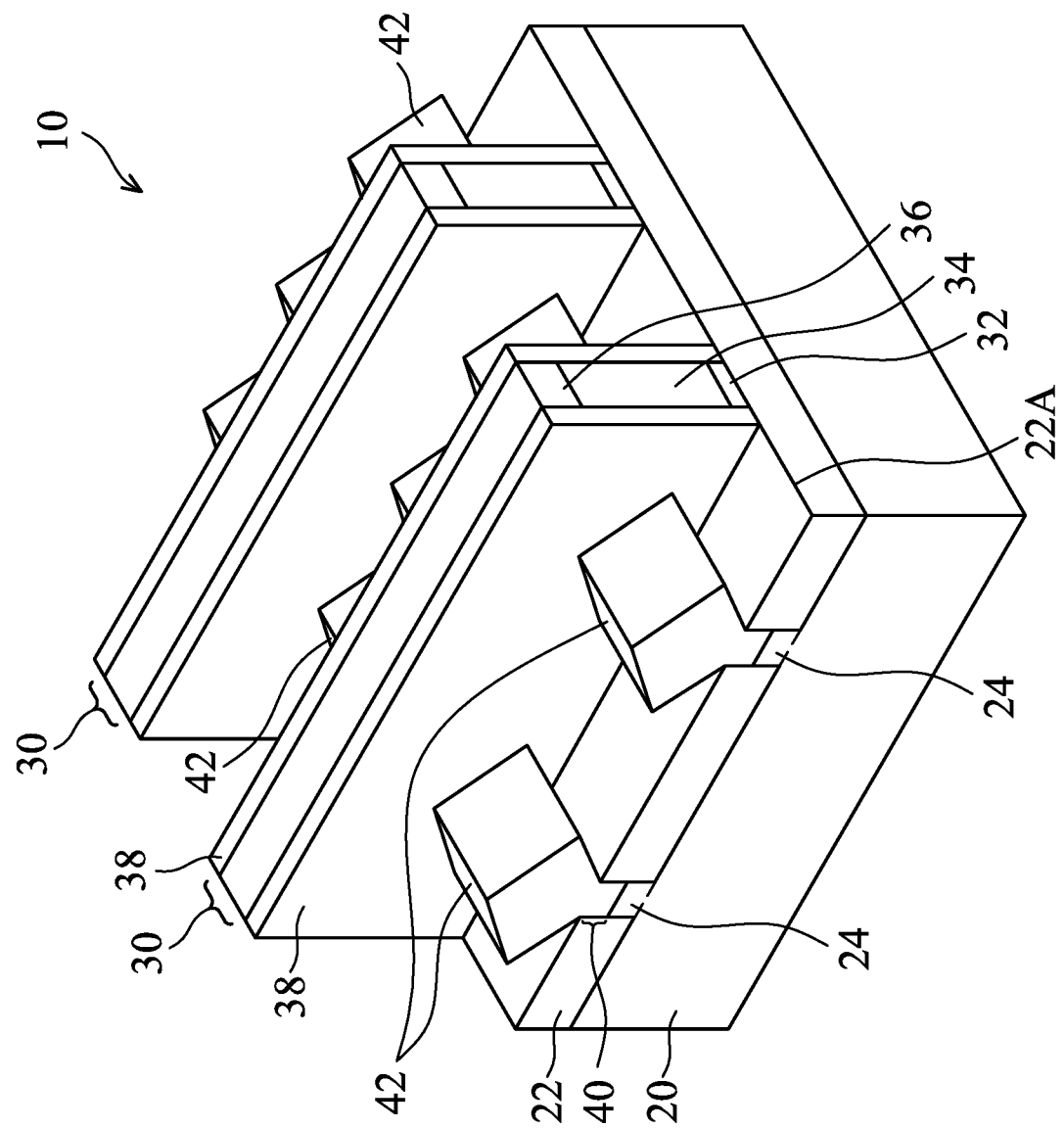

Next, epitaxy regions (source/drain regions) 42 are formed by selectively growing a semiconductor material from recesses 40, resulting in the structure in FIG. 5A. The respective process is illustrated as process 206 in the process flow as shown in FIG. 16. In accordance with some embodiments of the present disclosure, epitaxy regions 42 include silicon germanium, silicon, silicon carbon, or the like. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), GeB, or the like may be grown. Conversely, when the resulting FinFET is an n-type FinFET, silicon phosphorous (SiP), silicon carbon phosphorous (SiCP), or the like, may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, epitaxy regions 42 start expanding horizontally, and facets may be formed. Neighboring epitaxy regions 42 may merge with each other, or may be separated from each other.

After the epitaxy step, epitaxy regions 42 may be further implanted with a p-type or an n-type impurity to form source and drain regions, which are also denoted using reference numeral 42. In accordance with alternative embodiments of the present disclosure, the implantation step is skipped when epitaxy regions 42 are in-situ doped with the p-type or n-type impurity during the epitaxy. Epitaxy source/drain regions 42 may include lower portions that are formed in STI regions 22, and upper portions that are formed over the top surfaces of STI regions 22.

Figure 5B:
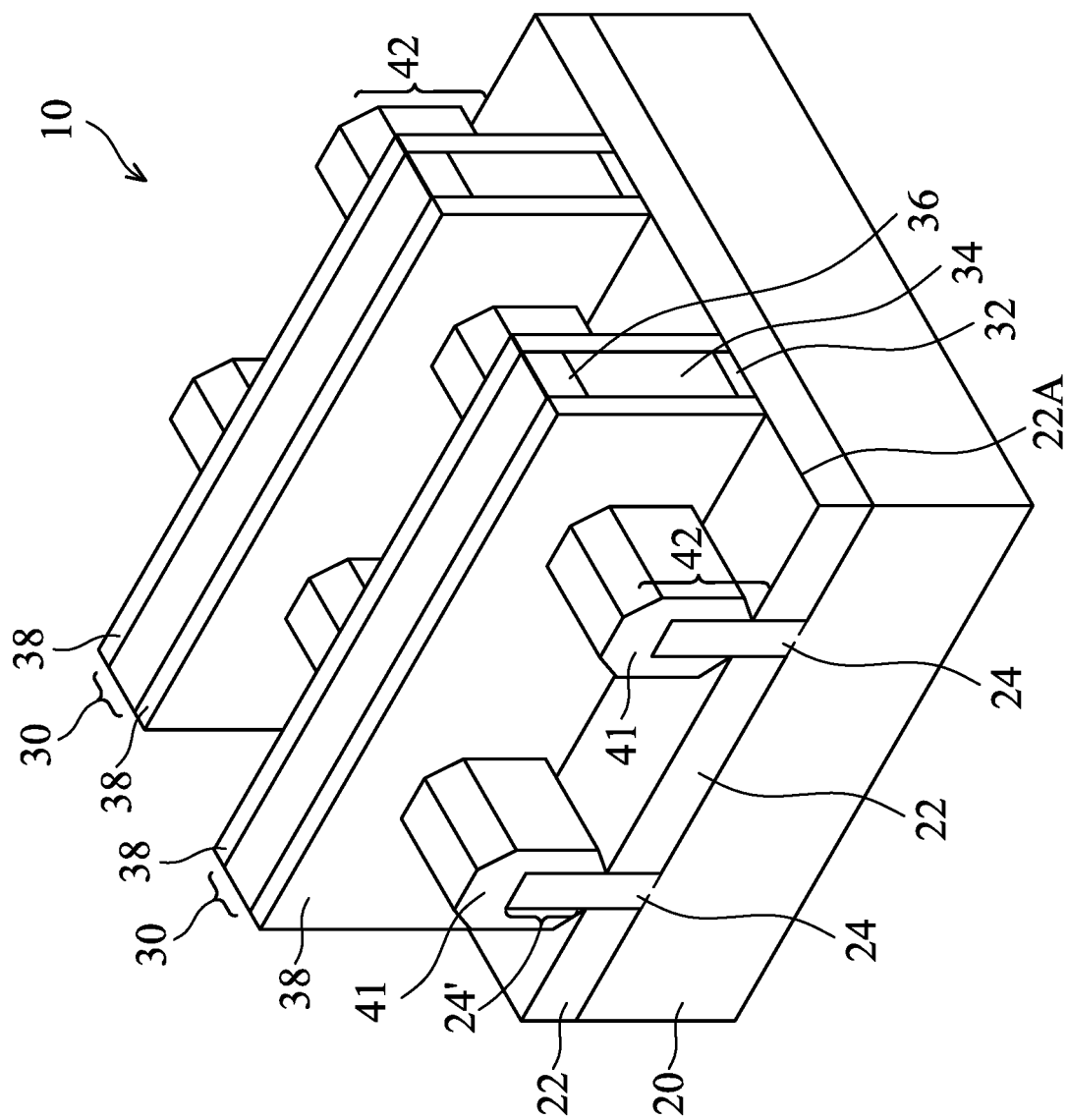

FIG. 5B illustrates the formation of cladding source/drain regions 42 in accordance with alternative embodiments of the present disclosure. In accordance with these embodiments, the protruding fins 24' as shown in FIG. 3 are not recessed, and epitaxy regions 41 are grown on protruding fins 24'. The material of epitaxy regions 41 may be similar to the material of the epitaxy semiconductor material 42 as shown in FIG. 5A, depending on whether the resulting FinFET is a p-type or an n-type FinFET. Accordingly, source/drains 42 include protruding fins 24' and the epitaxy region 41. An implantation may (or may not) be performed to implant an n-type impurity or a p-type impurity. The neighboring cladding source/drain regions 42 may also merge with each other, or stay separated from each other.

Figure 6A:
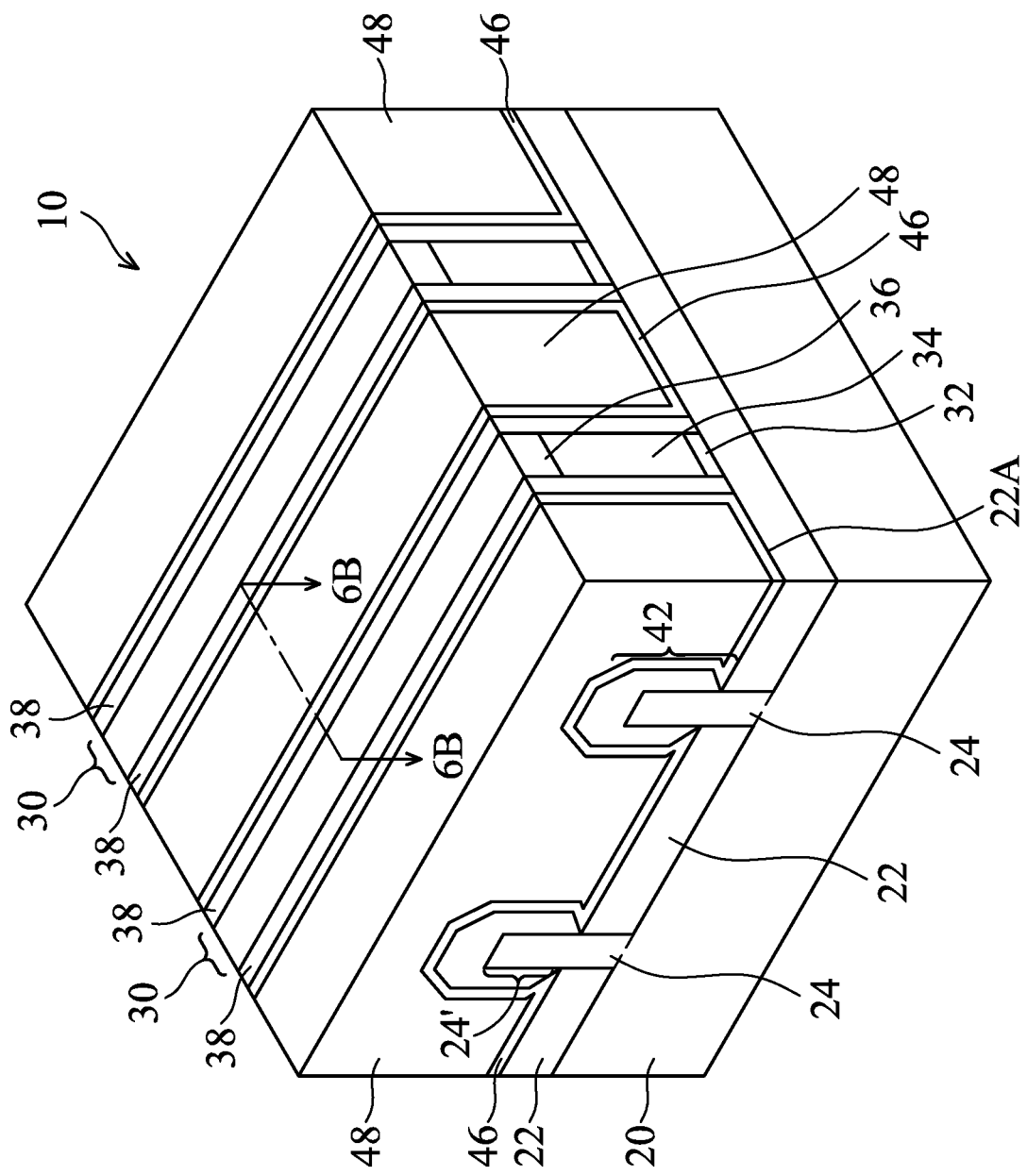

FIG. 6A illustrates a perspective view of the structure after the formation of Contact Etch Stop Layer (CESL) 46 and Inter-Layer Dielectric (ILD) 48. The respective process is illustrated as process 208 in the process flow as shown in FIG. 16. CESL 46 may be formed of silicon nitride, silicon carbo-nitride, or the like. CESL 46 may be formed using a conformal deposition method such as ALD or CVD, for example. ILD 48 may include a dielectric material formed using, for example, FCVD, spin-on coating, CVD, or another deposition method. ILD 48 may also be formed of an oxygen-containing dielectric material, which may be silicon-oxide based such as Tetra Ethyl Ortho Silicate (TEOS) oxide, Plasma-Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process is performed to level the top surfaces of ILD 48, dummy gate stacks 30, and gate spacers 38 with each other.

Figure 6B:
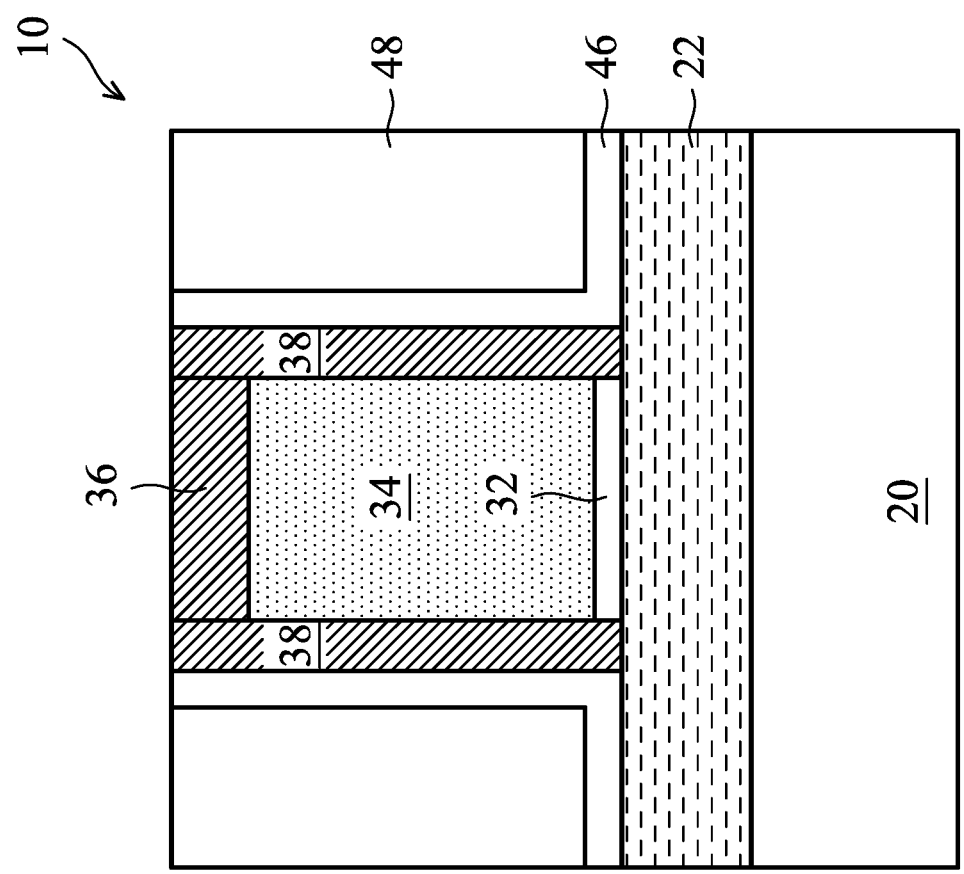

A cross-sectional view of the structure shown in FIG. 6A is illustrated in FIG. 6B. The cross-sectional view is obtained from the vertical plane containing line 6B-6B in FIG. 6A. As shown in FIG. 6B, one of dummy gate stacks 30 is illustrated. The illustrated portion of dummy gate stacks 30 is the portion directly over STI region 22. Protruding fins 24' are in other planes that are not shown.

Figure 7A:
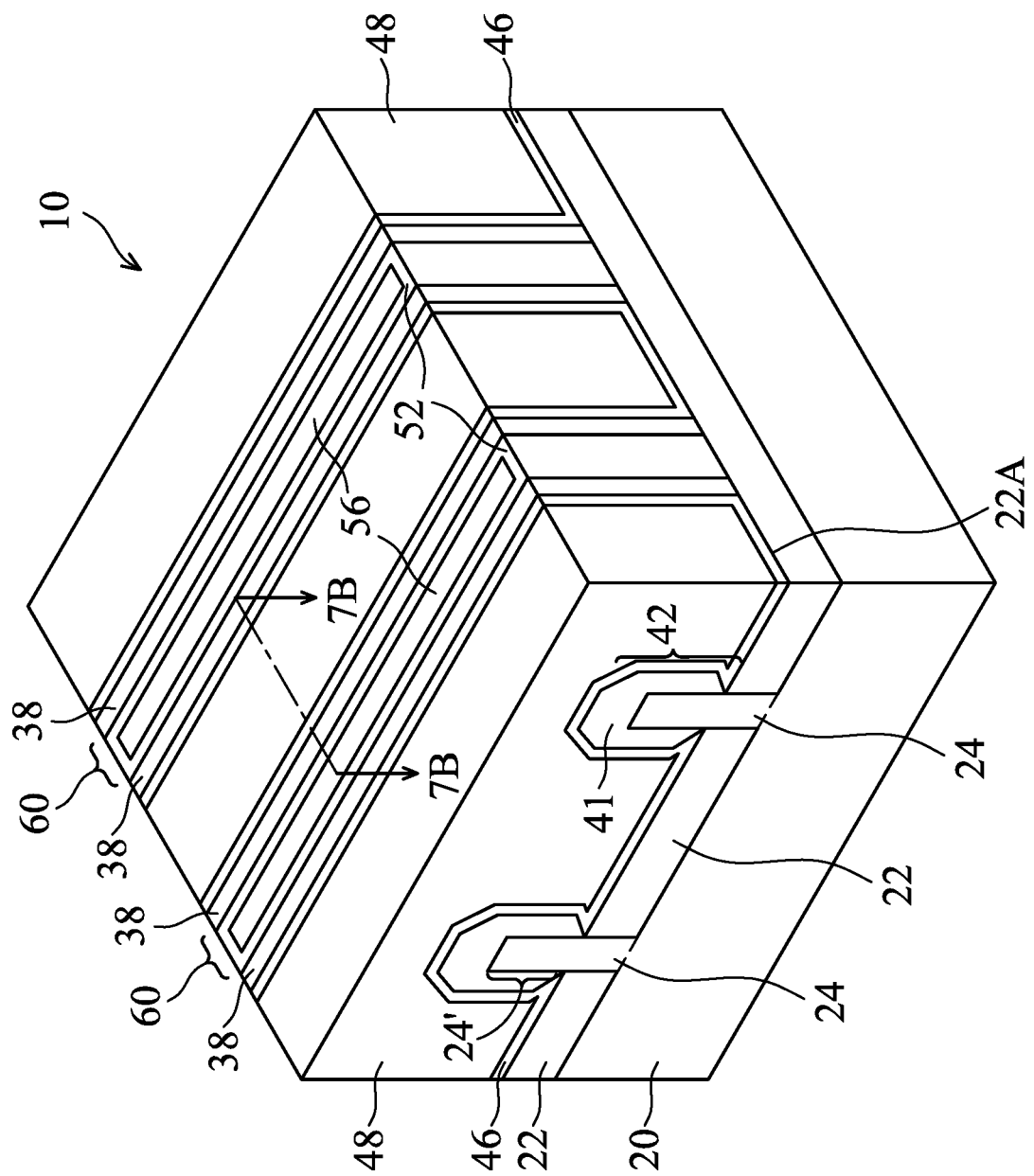
Figure 7B:
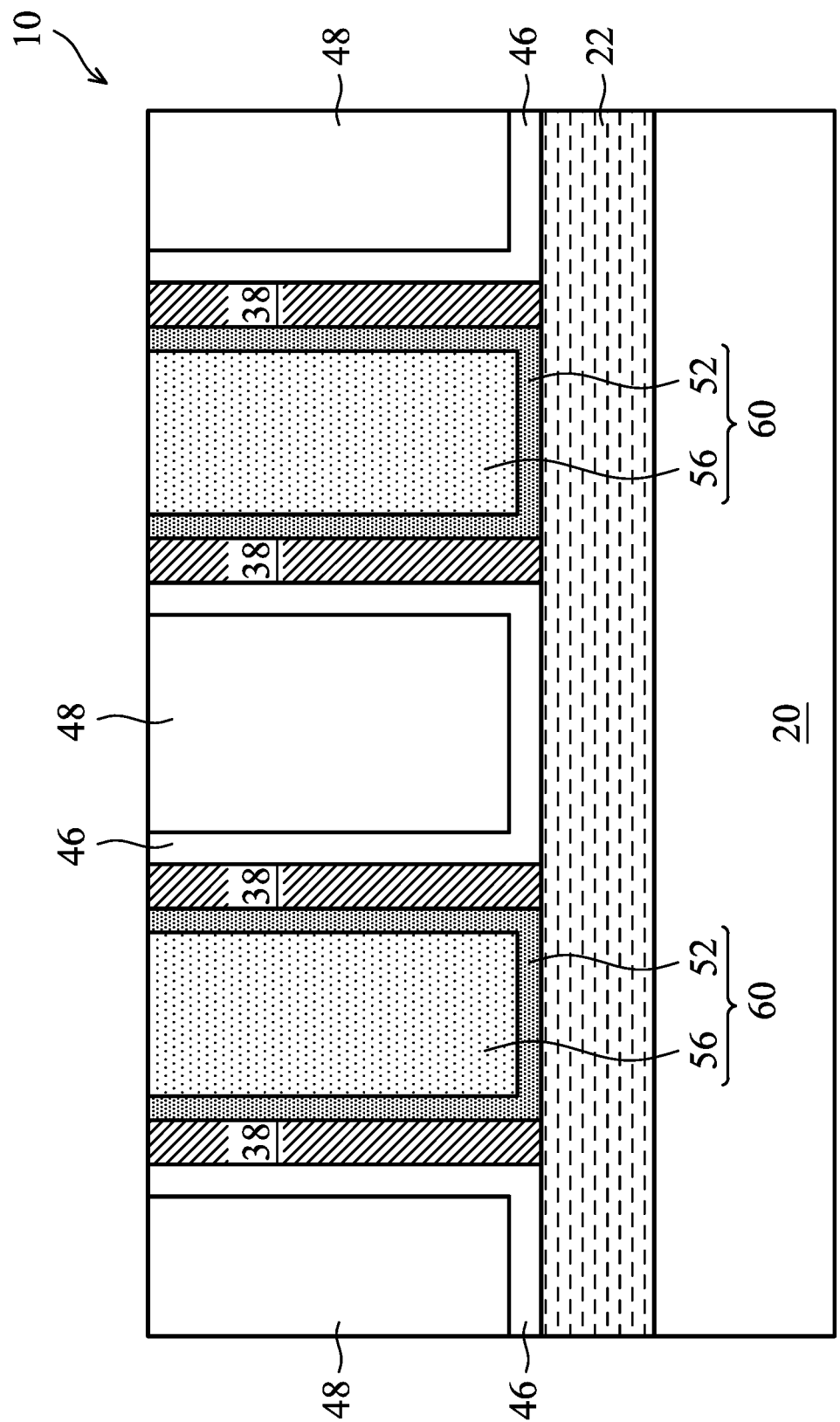

Next, dummy gate stacks 30, which include hard mask layers 36, dummy gate electrodes 34 and dummy gate dielectrics 32, are replaced with replacement gate stacks, which may include metal gates and replacement gate dielectrics as shown in FIGS. 7A and 7B. In accordance with some embodiments of the present disclosure, the replacement process includes etching hard mask layers 36, dummy gate electrodes 34, and dummy gate dielectrics 32 as shown in FIGS. 6A and 6B in one or a plurality of etching steps, resulting in openings to be formed between opposite portions of gate spacers 38. The respective process is illustrated as process 210 in the process flow as shown in FIG. 16. The respective structure may be realized from the structure shown in FIG. 6A by removing dummy gate stacks 30.

Next, referring to FIGS. 7A and 7B, (replacement) gate stacks 60 are formed, which include gate dielectric layers 54 (refer to FIG. 8C) and gate electrode 56. High-k dielectric layers 52, which are parts of gate dielectric layers 54, is viewable in FIGS. 7A and 7B. The respective process is illustrated as process 212 in the process flow as shown in FIG. 16. The formation of gate stacks 60 includes forming/depositing a plurality of layers, and then performing a planarization process such as a CMP process or a mechanical grinding process. Gate dielectric layers 54 extend into the trenches left by the removed dummy gate stacks. In accordance with some embodiments of the present disclosure, as shown in FIG. 8C, gate dielectric layers 54 include Interfacial Layers (IL) 50 as their lower parts. ILs 50 are formed on the exposed surfaces of protruding fins 24'. Each of ILs 50 may include an oxide layer such as a silicon oxide layer, which is formed through the thermal oxidation of protruding fins 24', a chemical oxidation process, or a deposition process. Gate dielectric layer 54 may also include high-k dielectric layer 52 formed over IL 50. High-k dielectric layer 52 includes a high-k dielectric material such as $HfO_2$, $ZrO_2$, HfZrOx, HfSiOx, HfSiON, ZrSiOx, HfZrSiOx, $Al_2O_3$, HfAlOx, HfAlN, ZrAlOx, $La_2O_3$, $TiO_2$, $Yb_2O_3$, silicon nitride, or the like. The dielectric constant (k-value) of the high-k dielectric material is higher than 3.9, and may be higher than about 7.0. High-k dielectric layer 52 is formed as a conformal layer, and extends on the sidewalls of protruding fins 24' and the sidewalls of gate spacers 38. In accordance with some embodiments of the present disclosure, high-k dielectric layer 52 is formed using ALD or CVD.

Referring back to FIGS. 7A and 7B, gate electrodes 56 are formed on top of dielectric layers 52, and fill the remaining portions of the trenches left by the removed dummy gate stacks. The sub-layers in gate electrodes 56 are not shown separately in FIG. 7A, while the sub-layers are distinguishable from each other due to the difference in their compositions. The deposition of at least lower sub-layers may be performed using conformal deposition methods such as ALD or CVD, so that the thickness of the vertical portions and the thickness of the horizontal portions of gate electrodes 56 (and each of sub-layers) are substantially equal to each other.

Gate electrodes 56 may include a plurality of layers including, and not limited to, a Titanium Silicon Nitride (TSN) layer, a tantalum nitride (TaN) layer, a titanium nitride (TiN) layer, a titanium aluminum (TiAl) layer, an additional TiN and/or TaN layer, and a filling metal. Some of these layers define the work function of the respective FinFET. It is appreciated that this layer stack is an example, and metal stacks having different structures may be adopted. Gate dielectrics 54 and gate electrodes 56 are in combination referred to replacement gate stacks 60 or metal gate stacks 60. Furthermore, the metal layers of p-type FinFETs and the metal layers of n-type FinFETs may be different from each other so that the work functions of the metal layers are suitable for the respective p-type or n-type FinFETs. The filling metal may include aluminum, copper, tungsten, cobalt, or the like.

FIG. 7B illustrates the cross-sectional view of metal gate stacks 60. The cross-sectional view is obtained from the vertical plane containing 7B-7B as shown in FIG. 7A. Since the cross-sectional view is obtained from the plane crossing STI regions 22 rather than protruding fins 24', IL 50 (FIG. 8C) may not exist in the cross-sectional view. Rather, high-k dielectric layer 52 contacts the top surface of STI region 22.

Figure 8A:
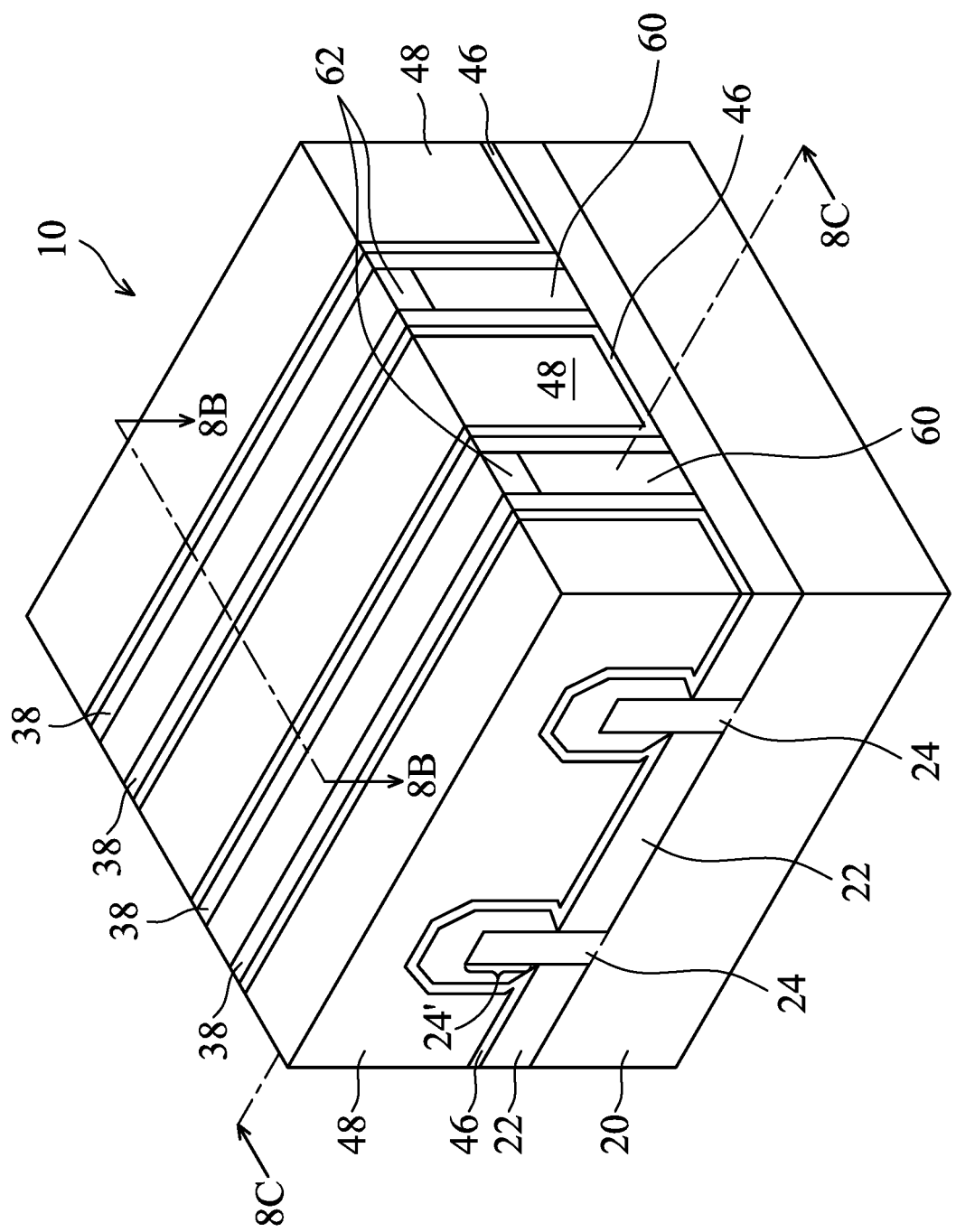
Figure 8B:
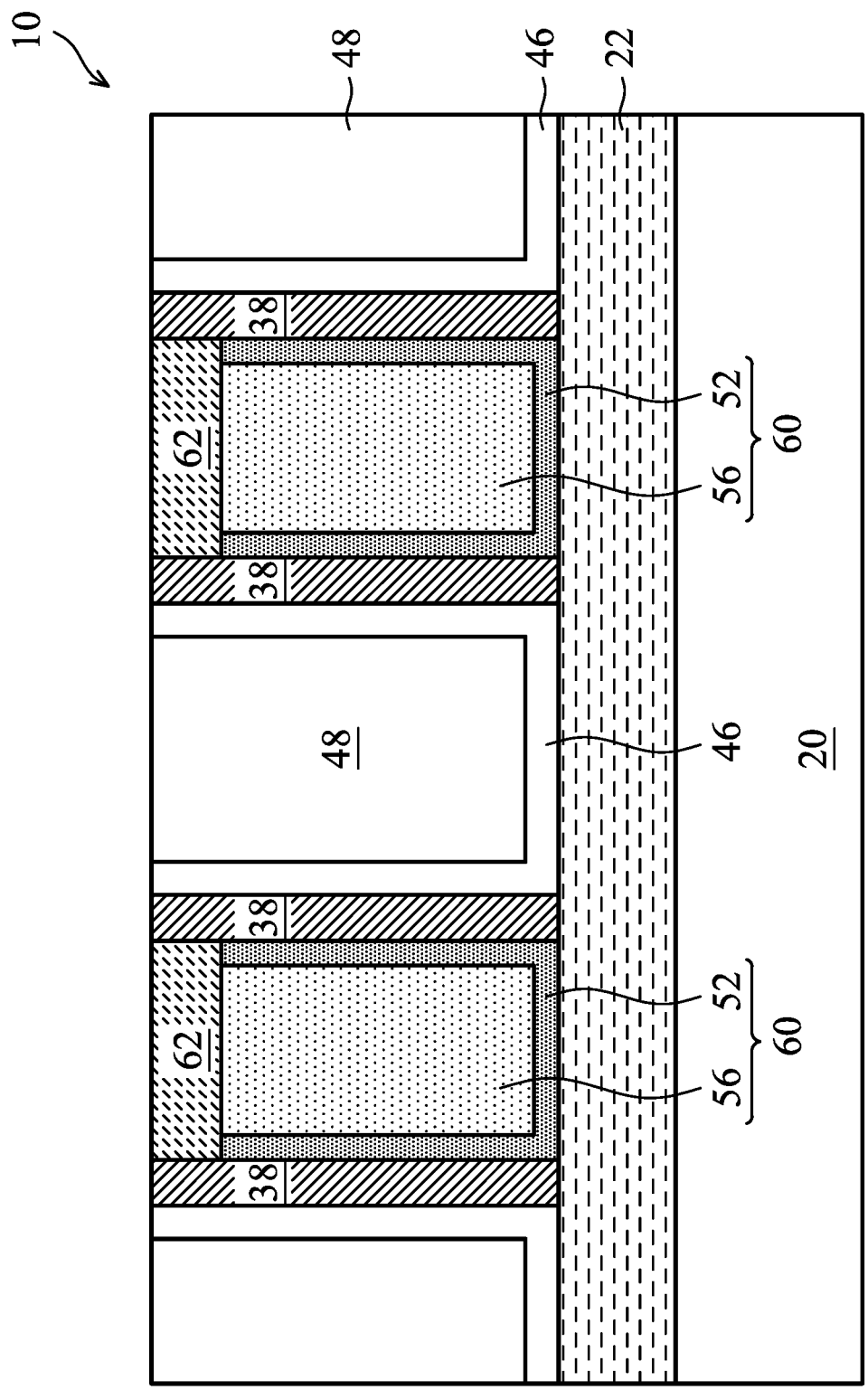
Figure 8C:
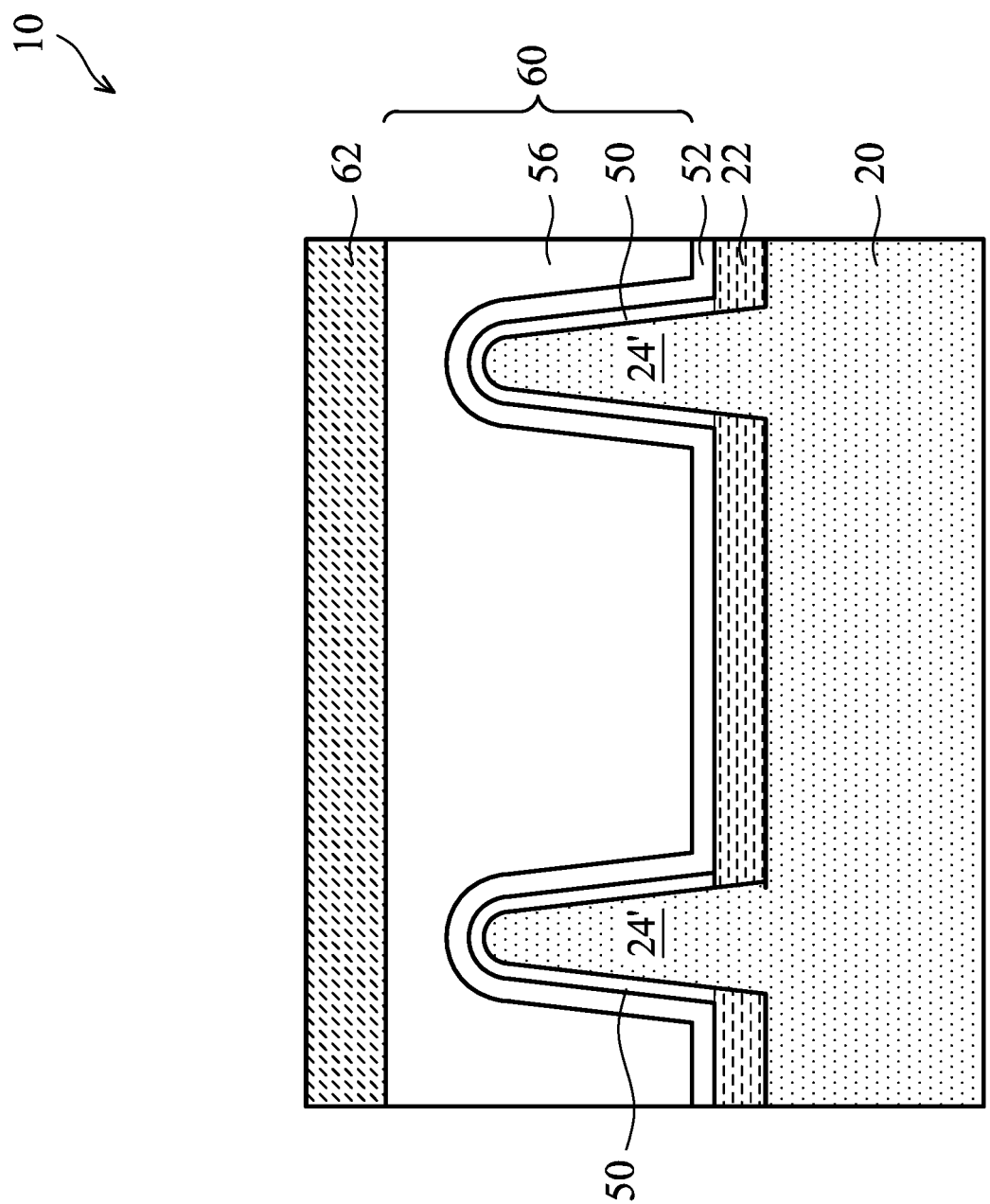

Next, as shown in FIGS. 8A, 8B, and 8C, dielectric hard masks 62 are formed. The respective process is illustrated as process 214 in the process flow as shown in FIG. 16. The material of hard masks 62 may be the same as or different from some of CESL 46, ILD 48, and/or gate spacers 38. In accordance with some embodiments of the present disclosure, the formation of hard masks 62 includes recessing replacement gate stacks 60 through etching to form recesses, filling a dielectric material into the recesses, and performing a planarization to remove the excess portions of the dielectric material. The remaining portions of the dielectric material are hard masks 62. In accordance with some embodiments of the present disclosure, hard masks 62 are formed of silicon nitride, silicon oxynitride, silicon oxy-carbide, silicon oxy carbo-nitride, or the like.

FIG. 8B illustrates a cross-sectional view of the structure shown in FIG. 8A, with the cross-sectional view obtained from the plane containing line 8B-8B in FIG. 8A. FIG. 8C illustrates a cross-sectional view obtained from the vertical plane containing line 8C-8C in FIG. 8A.

Figure 9A:
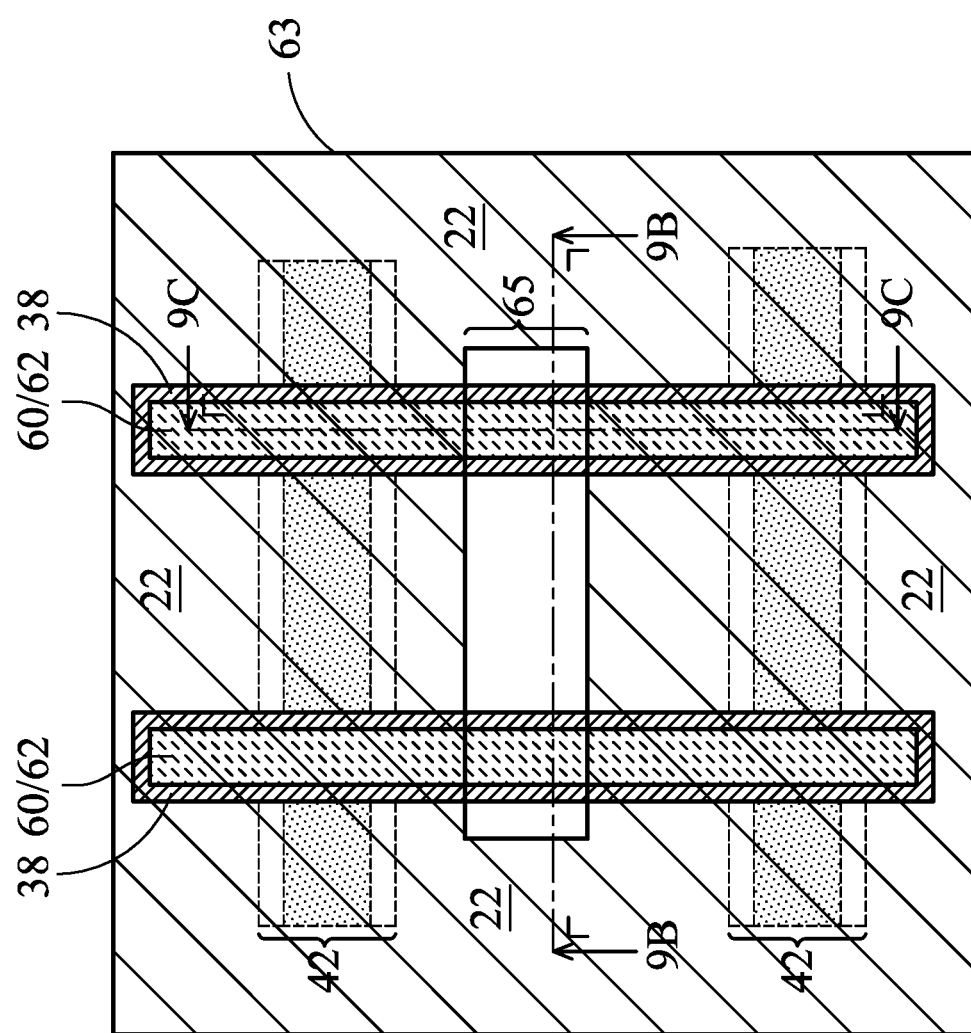
Figure 9B:
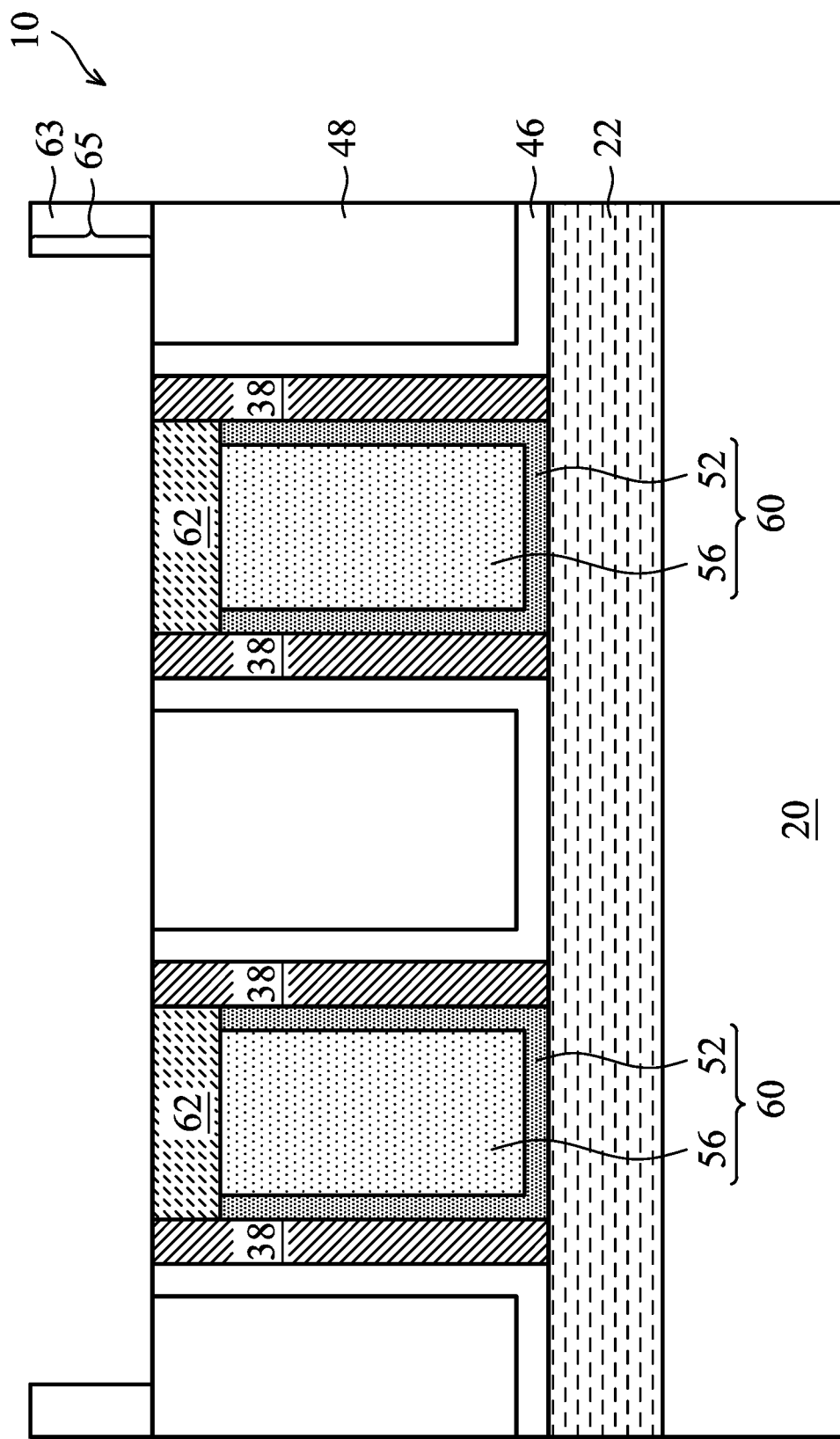
Figure 9C:
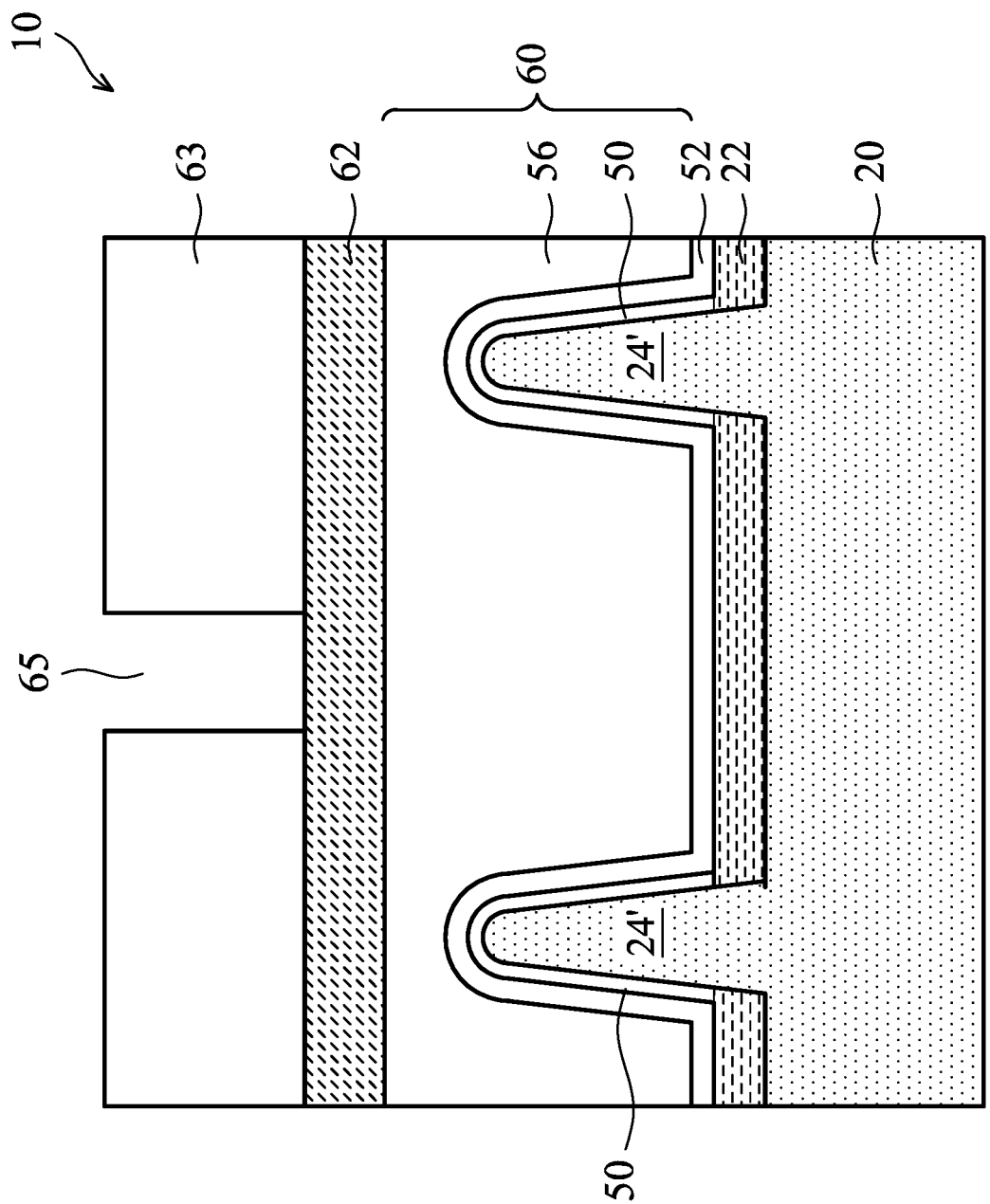
Figure 9D:
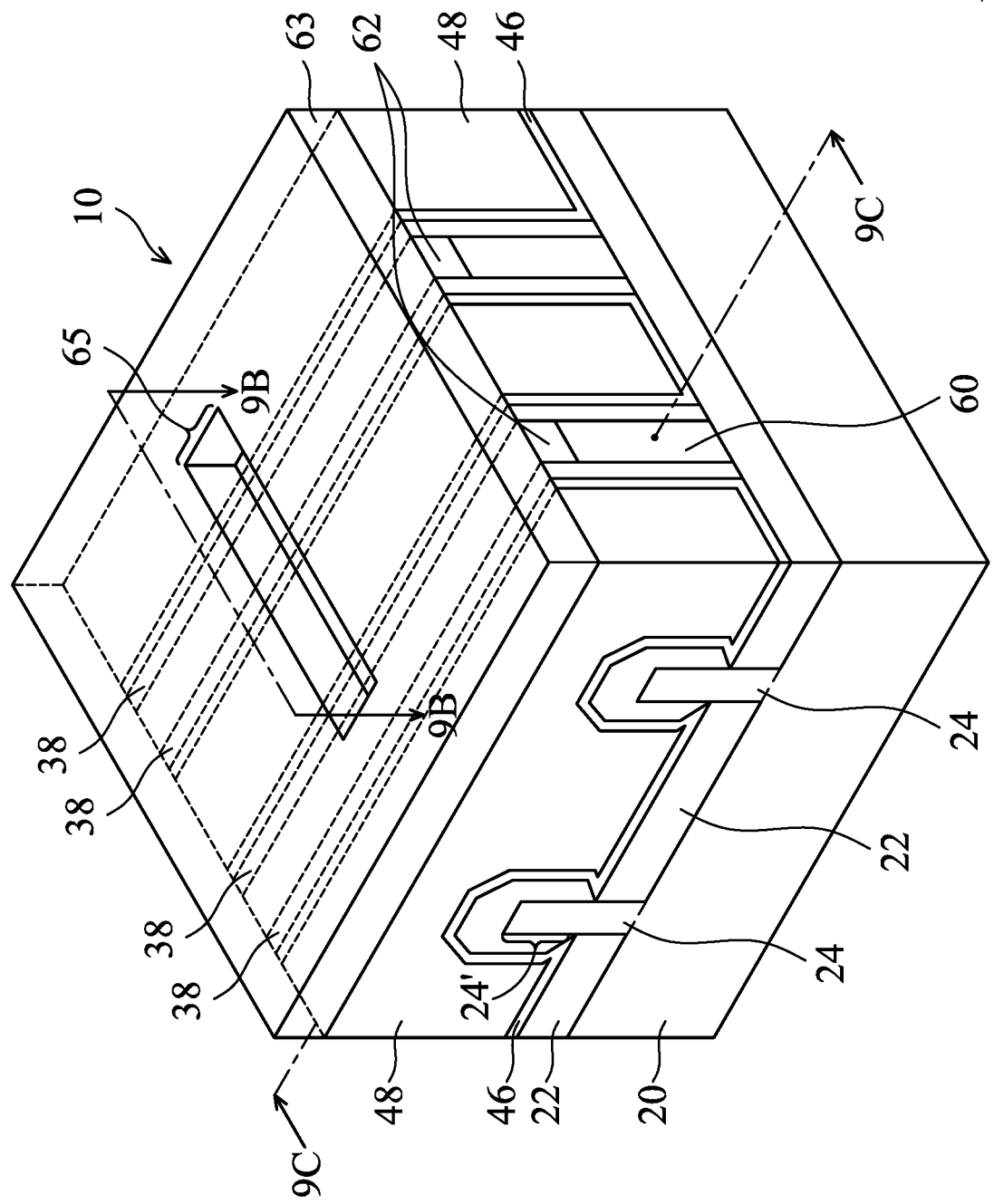

FIGS. 9A, 9B, and 9C illustrate the formation and the patterning of etching mask 63. Etching mask 63 is deposited, and opening 65 is formed in etching mask 63. Etching mask 63 may be formed of photo resist, titanium nitride, boron nitride, silicon nitride, or the like, and the material of etching mask 63 is different from the materials of the underlying materials of gate spacers 38, hard masks 62, metal gate stacks 60, and ILD 48. The material of etching mask 63 may also be different from that of CESL 46 and gate spacers 38. When etching mask 63 is formed of a non-photo-resist material, a patterned photo resist (not shown) may be formed over hard mask 62, and etching mask 63 is etched using the photo resist as an etching mask. FIGS. 9B and 9C illustrate the cross-sectional views obtained from the planes containing line 9B-9B and line 9C-9C, respectively, in FIG. 9A. FIG. 9D illustrates a perspective view, and lines 9B-9B and 9C-9C, from which the cross-sectional views are obtained, are also shown in FIG. 9D.

Figure 10A:
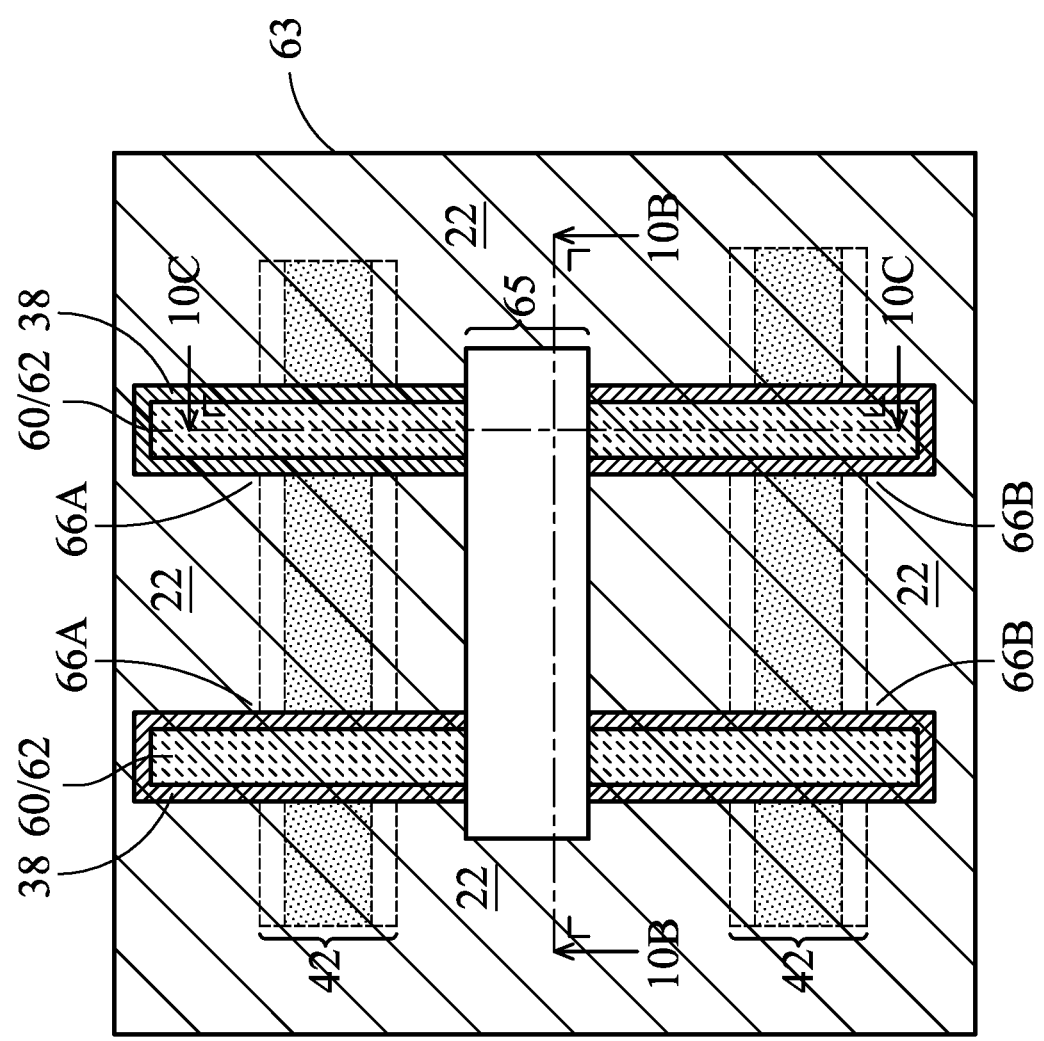
Figure 10B:
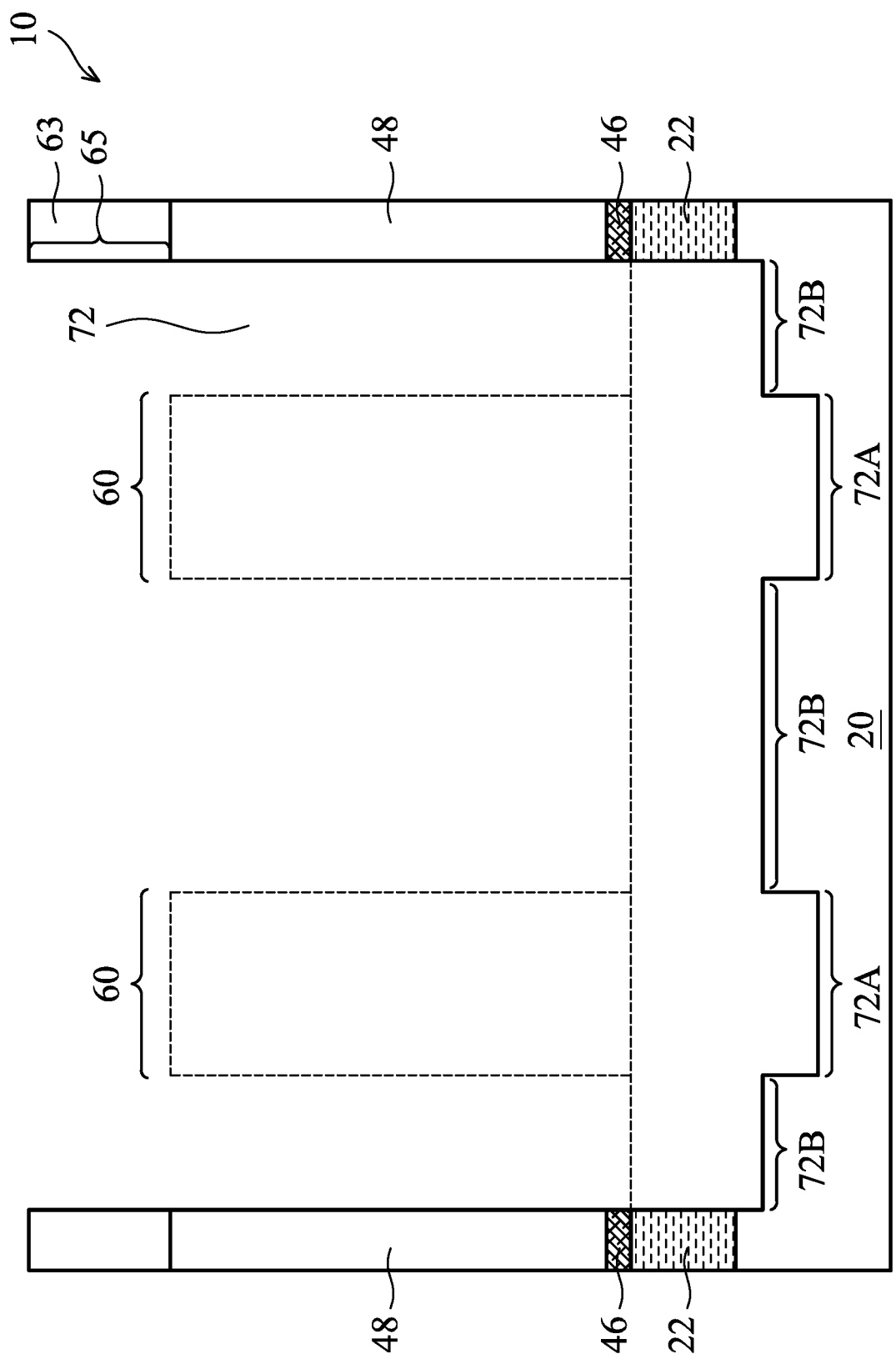
Figure 10C:
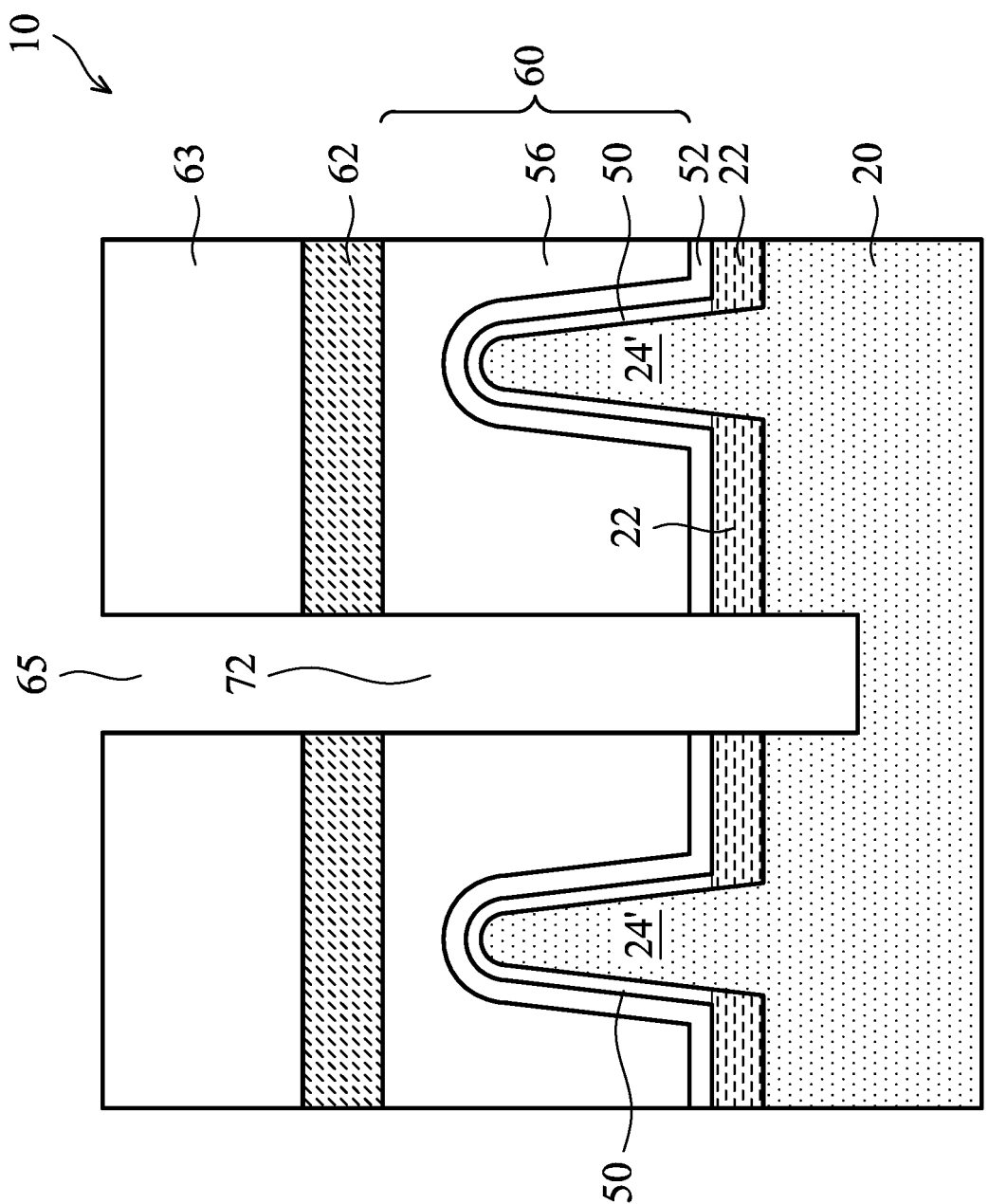

FIGS. 10A, 10B, and 10C illustrate the etching of gate stacks 60. The respective process is illustrated as process 218 in the process flow as shown in FIG. 16. FIGS. 10B and 10C illustrate the cross-sectional views obtained from the same planes containing line 10B-10B and line 10C-10C, respectively, in FIG. 10A. The etching results in the removal of the portions of metal gate stacks 60 exposed through opening 65. Each of metal gate stacks 60 is thus cut apart into separate portions, each may act as a replacement gate electrode of one of FinFETs 66A and 66B (FIG. 10A). The respective process is thus referred to as a cut-metal (or cut-metal-gate) process. The etching results in opening 72, as shown in FIGS. 10B and 10C.

In accordance with some embodiments of the present disclosure, the etching is performed using process gases selected from, and not limited to, $SiCl_4$, $O_2$, $C_4F_6$, HBr, He, and combinations thereof. The etching may be performed with a pressure in the range between about 3 mTorr and about 10 mTorr. An RF power is applied in the etching, and the RF power may be in the range between about 500 Watts and about 900 Watts. A bias voltage is also applied.

The etching is anisotropic, and hence the sidewalls of opening 72 are substantially vertical. In the etching process, the exposed portions of hard masks 62, metal gate stacks 60, ILD 48 (refer to FIG. 9B), are removed. CESL 46 and gate spacers 38 are also removed. Accordingly, the underlying portions of STI regions 22 are exposed. The etching may continue until STI regions 22 are etched through, and opening 72 extends into bulk substrate 20. The etching may also be stopped at an intermediate level between a top surface and a bottom surface of STI regions 22. The etching gas is selected to mainly attack the metals in metal gate stacks 60 to ensure their removal. Accordingly, the etching rates of ILD 48, gate spacers 38, CESL 46, and STI regions 22 may be lower than the etching rate of metal gate stacks 60. As a result, opening 72 includes portions 72A, which are directly under the removed portions (with dashed rectangles indicating the positions) of metal gate stacks 60, and portions 72B directly underlying ILD 48 and gate spacers 38. Portions 72B are shallower than portions 72A.

Figure 11A:
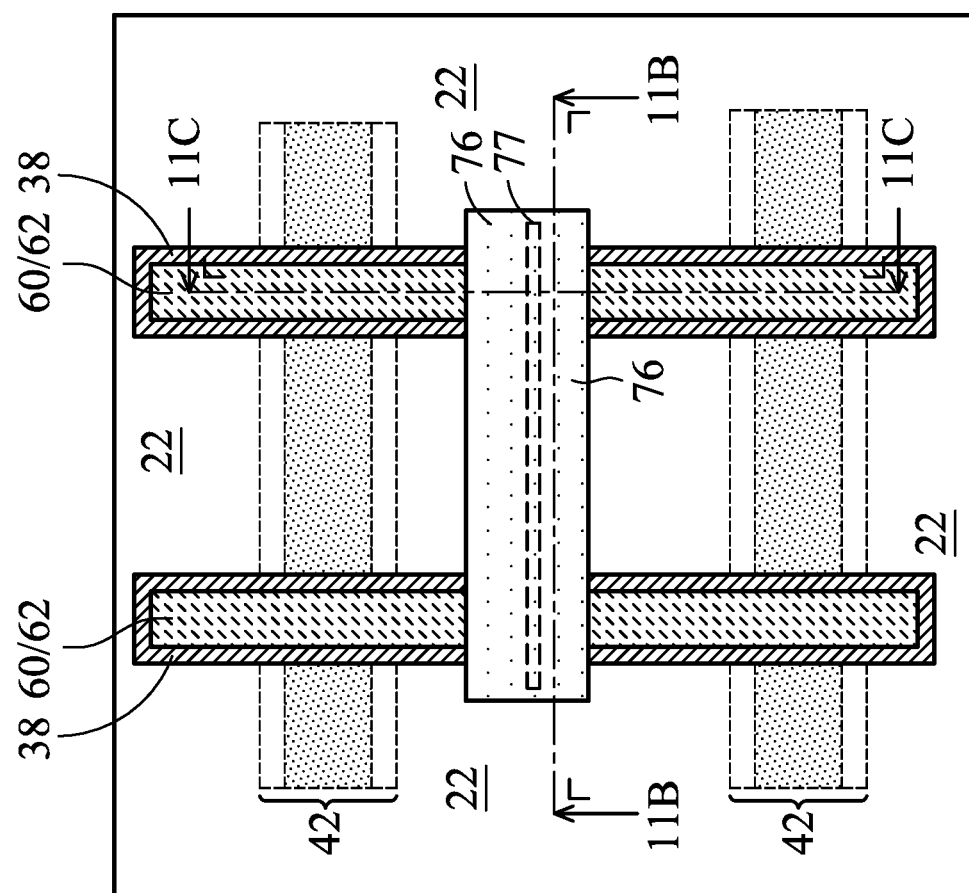
Figure 11B:
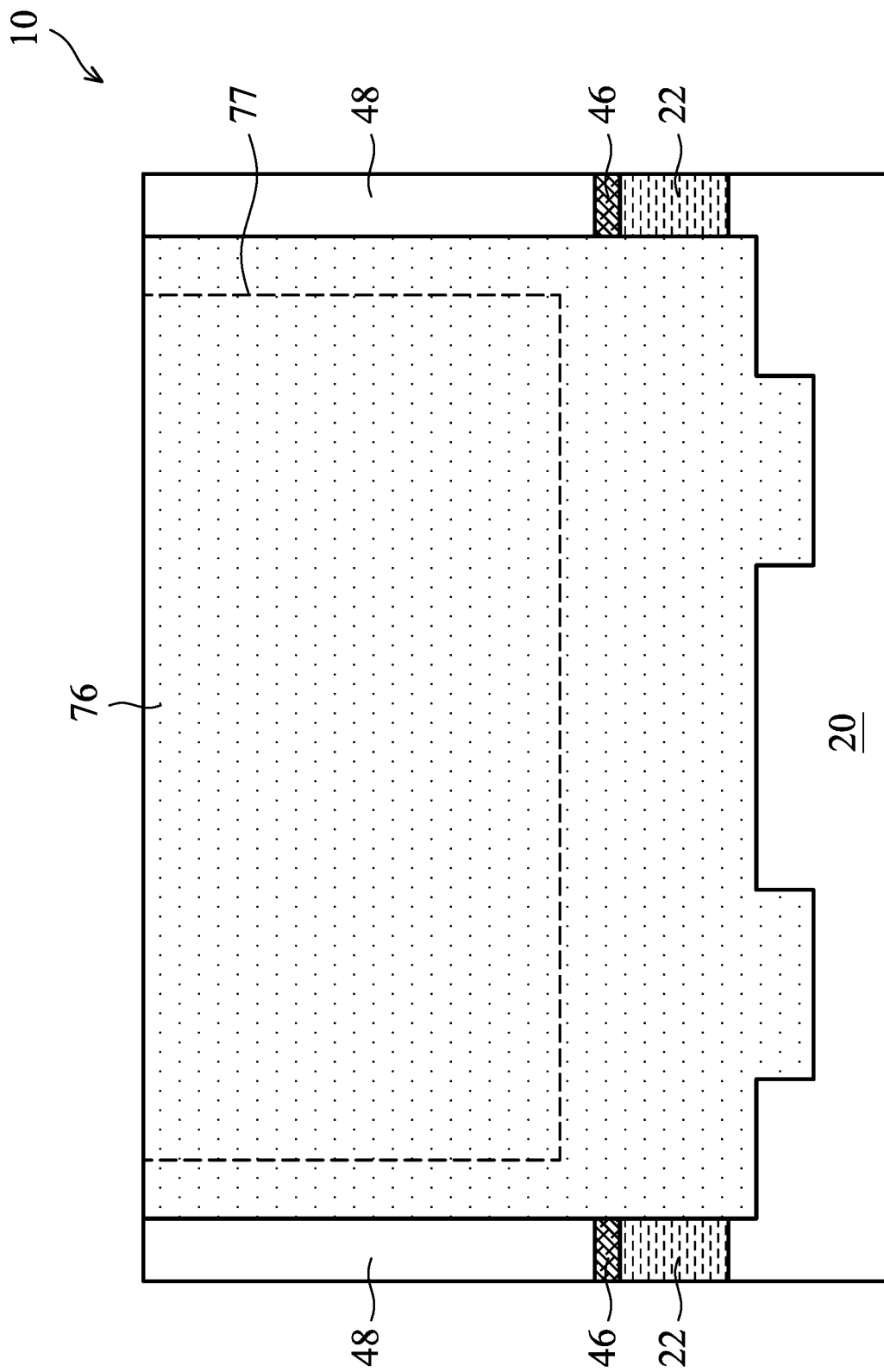
Figure 11C:
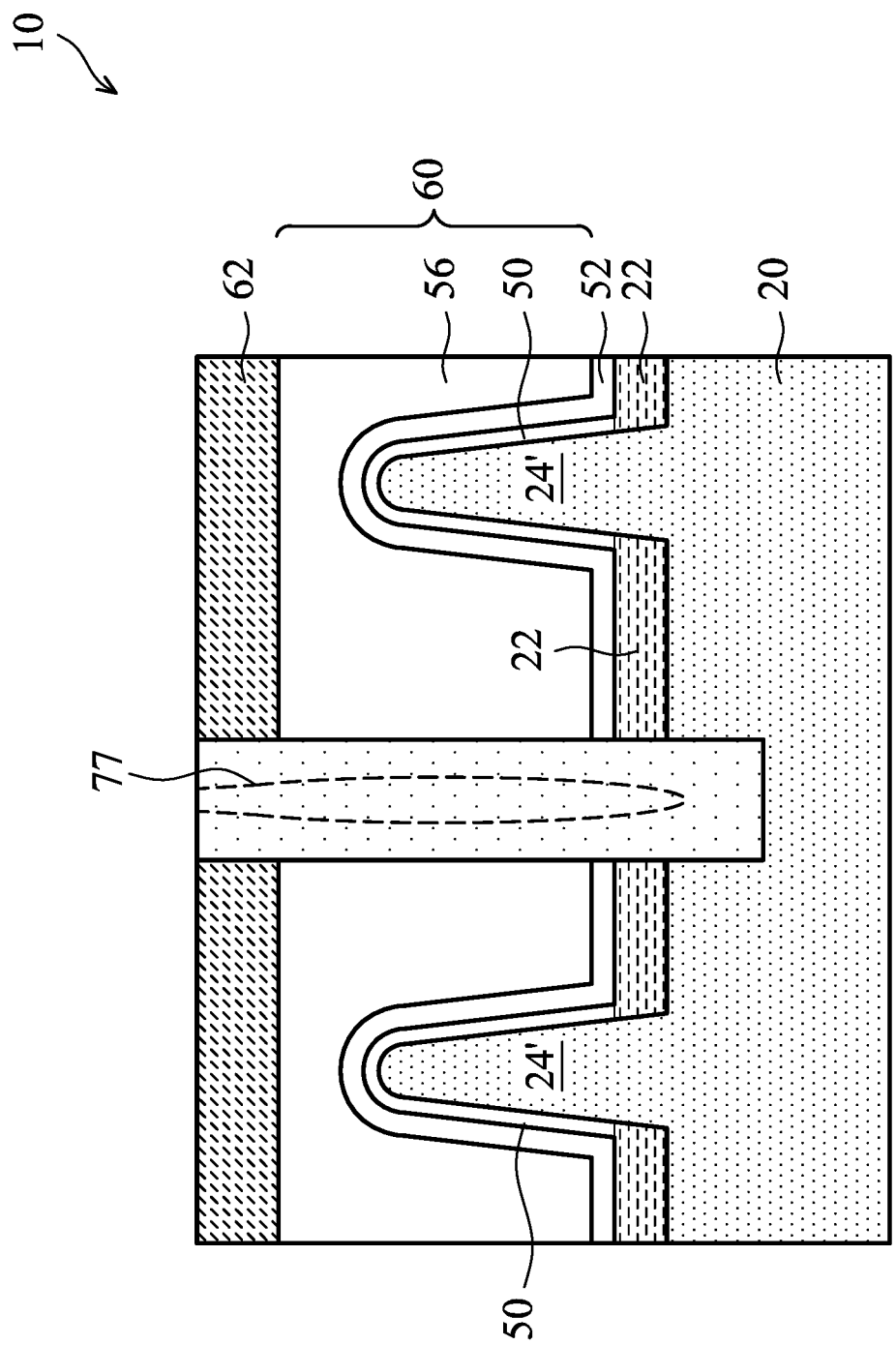

FIGS. 11A, 11B and 11C illustrate the formation of dielectric isolation region 76, which is alternatively referred to as cut-metal isolation region 76. The respective process is illustrated as process 220 in the process flow as shown in FIG. 16. FIG. 11A illustrates a top view of the resulting structure, which shows that dielectric isolation region 76 separates the gate stacks of FinFETs 66A and 66B. FIG. 11B is obtained from the plane containing line 11B-11B in FIG. 11A. FIG. 11C is obtained from the plane containing line 11C-11C in FIG. 11A.

The formation of dielectric isolation region 76 may include depositing a dielectric material into opening 72 (FIGS. 10A, 10B and 10C), and performing a planarization process such as a CMP process or a mechanical grinding process to remove the excess portions of the dielectric material. The filling method may include atomic layer deposition, low-pressure chemical vapor deposition, spin-on coating, Plasma Enhanced Chemical Vapor Deposition (PECVD), or the like. The filling material may include silicon nitride, silicon oxide, silicon carbide, silicon oxynitride, silicon oxy-carbide, or the like. Etching mask 63 (FIGS. 10A, 10B, and 10C) is then removed. In accordance with some embodiments of the present disclosure, etching mask 63 is removed in the CMP process or an etching process.

Referring to FIGS. 11A, 11B and 11C, in the formation of dielectric isolation region 76, void 77 may be formed due to the pre-mature sealing of the deposited dielectric material. Void 77 may be fully sealed in the dielectric material at the time the deposition is finished, and may be exposed after the planarization process due to the removal of the top portion that seals void 77.

Figure 12A:
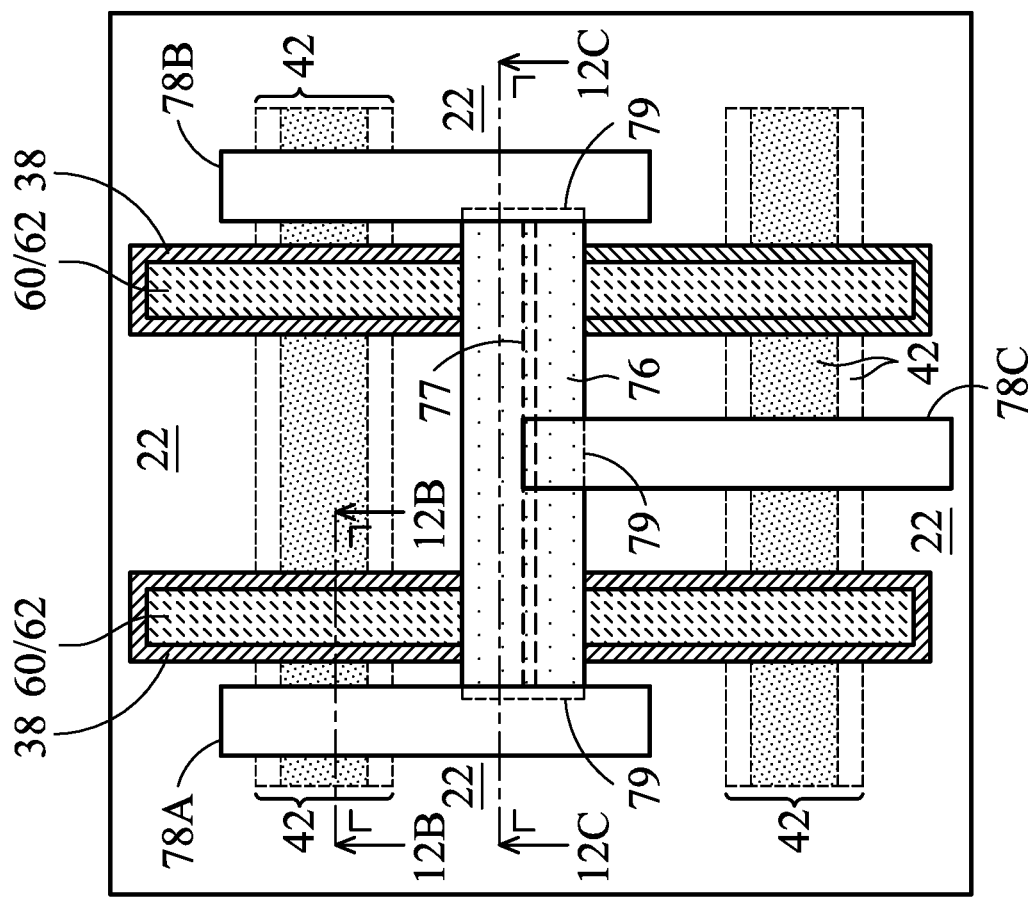
Figure 12B:
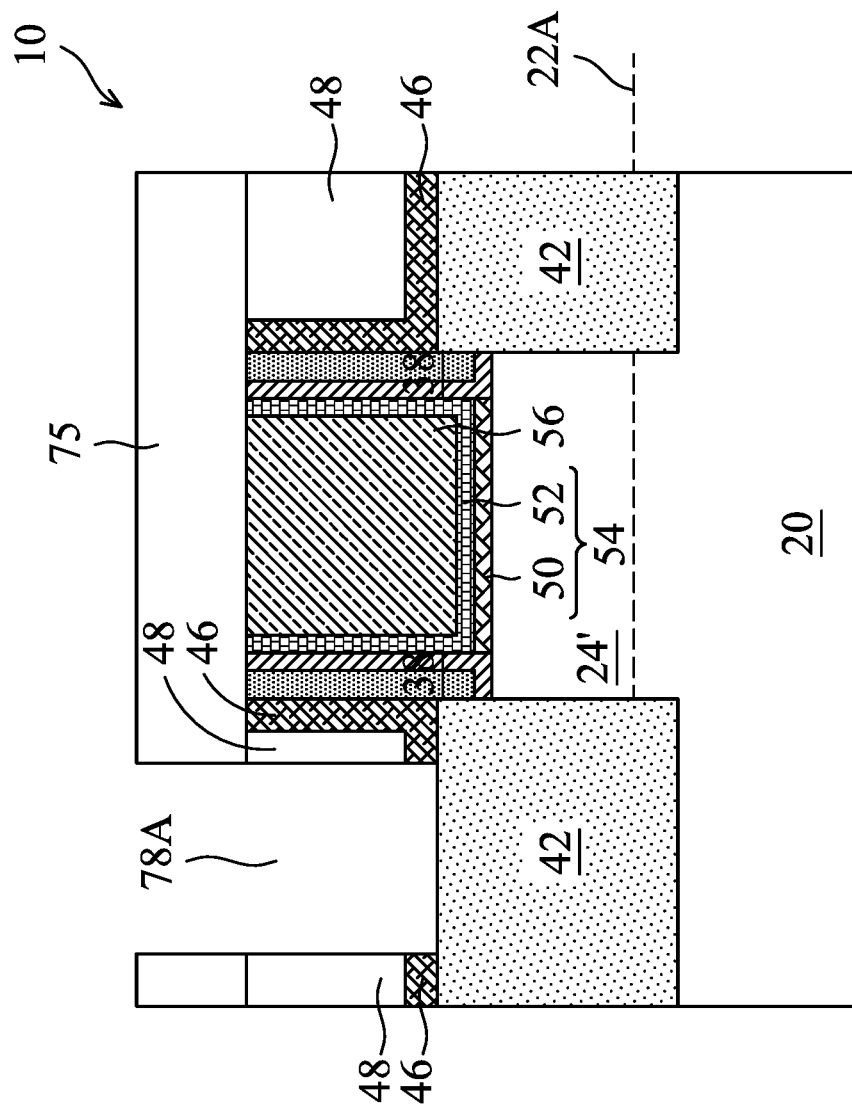
Figure 12C:
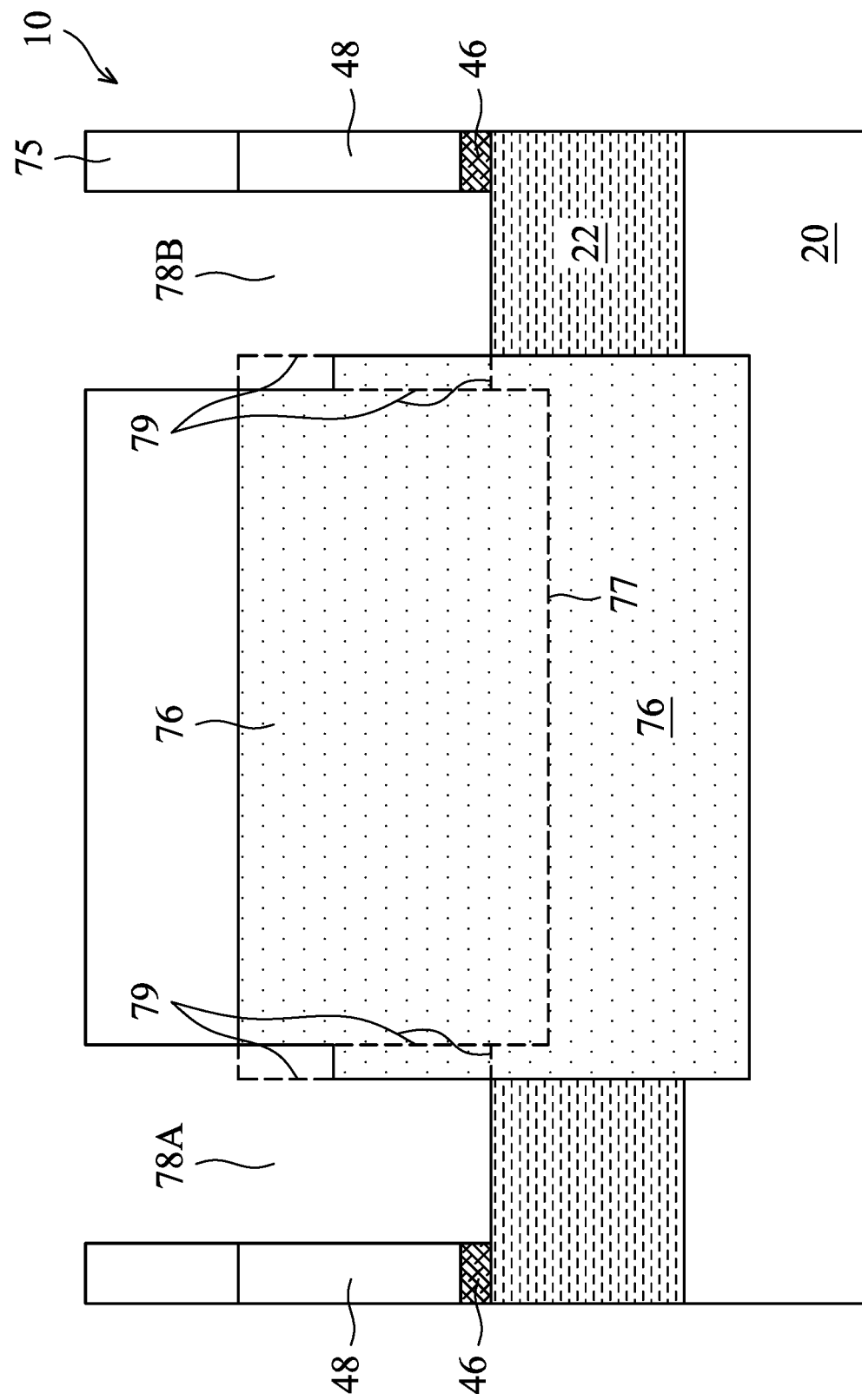

FIGS. 12A, 12B, and 12C through 14A, 14B, and 14C illustrate the formation of contact plugs, which are connected to the source/drain regions of FinFETs. FIGS. 12A, 12B, and 12C illustrate the formation of contact openings. The respective process is illustrated as process 222 in the process flow as shown in FIG. 16. Referring to FIG. 12A, openings 78A, 78B, and 78C, which are collectively and individually referred to as openings 78, are formed. FIG. 12B illustrates a cross-sectional view obtained from the plane crossing line 12B-12B in FIG. 12A. FIG. 12C illustrates a cross-sectional view obtained from the plane crossing line 12C-12C in FIG. 12A.

As shown in FIGS. 12B and 12C, a patterned etching mask 75, which may be a photo resist, is formed, and an etching process is performed to form openings 78. In accordance with some embodiments of the present disclosure, as shown in FIG. 12A, openings 78 encroach into the regions in which dielectric isolation region 76 is formed, so that the features may be laid out closer, and chip area is saved. In accordance with some other embodiments, each of openings 78A, 78B, and 78C may or may not encroach into dielectric isolation region 76. Openings 78A, 78B, and 78C are formed to reveal source/drain regions 42 of FinFETs. In the examples of the illustrative embodiments, each of openings 78A and 78B cuts into one end of dielectric isolation region 76. The portions of dielectric isolation region 76 exposed to openings 78A and 78B may be etched partially or fully when openings 78A and 78B are formed. Alternatively, the formation of openings in dielectric isolation region 76 is performed using an etchant that does not attack dielectric isolation region 76, so that the portions of dielectric isolation region 76 exposed through the openings in the patterned etching mask 75 are not etched. FIG. 12C illustrates some embodiments in which the dashed lines 79 are drawn to show the portions of dielectric isolation region 76 that may or may not be removed. In accordance with some embodiments of the present disclosure, as shown in FIG. 12C, the etching rate of dielectric isolation region 76 is lower than the etching rate of ILD 48, so that the portions of the opening extending into dielectric isolation region 76 is shallower than the portions of the opening extending into ILD 48 and CESL 46.

As shown in FIG. 12B, after the formation of openings 78 (such as 78A as in the illustrated cross-section), source/drain regions 42 are revealed through openings 78. In the formation of openings 78, ILD 48 and CESL 46 are etched. FIG. 12C illustrates that in the cross-sectional view obtained from the plane containing line 12C-12C in FIG. 12A, openings 78 is stopped on STI region 22. The portions of dielectric isolation region 76 exposed to the etchant may or may not be removed in the etching, depending on the material of dielectric isolation region 76 and the adopted etchant. When dielectric isolation region 76 is removed, and when void 77 is formed, void 77 may have its ends (the illustrated left and right ends, for example) exposed to openings 78, as shown in FIGS. 12A and 12C. Alternatively stated, openings 78A and/or 78B may be joined to void 77 to form a continuous opening/void.

Figure 13A:
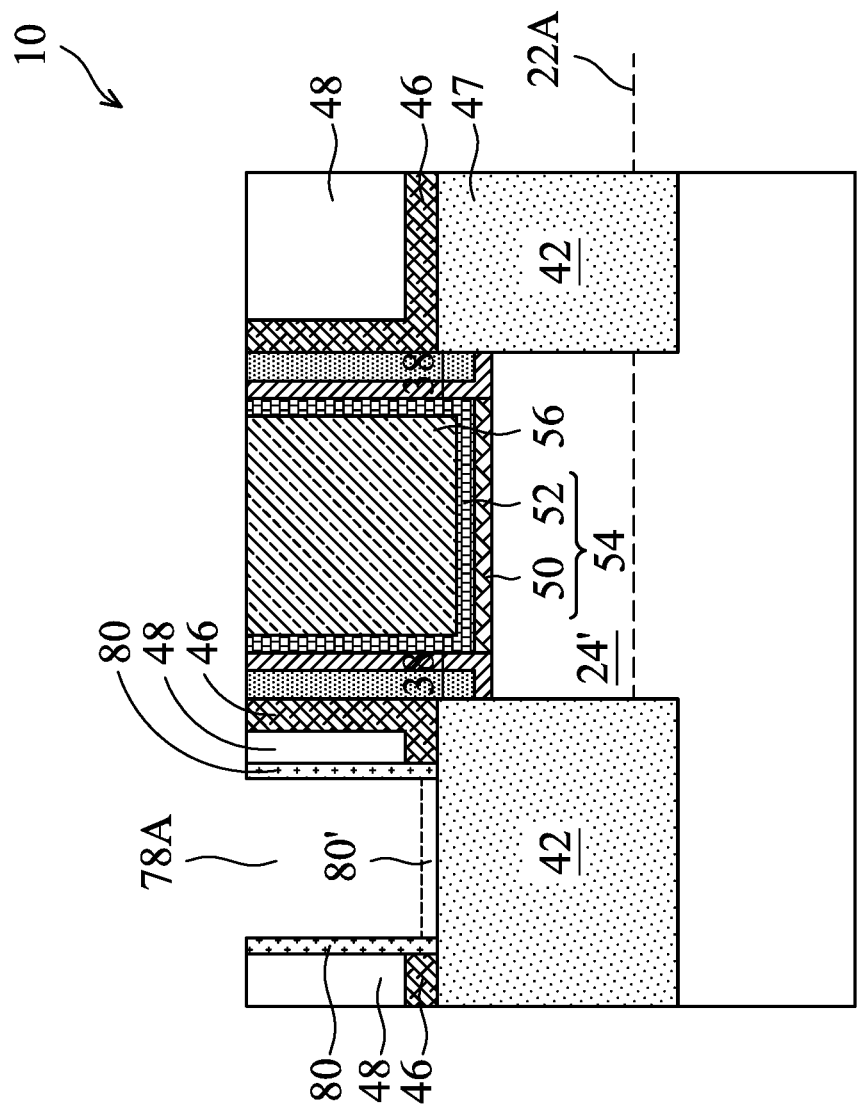
Figure 13B:
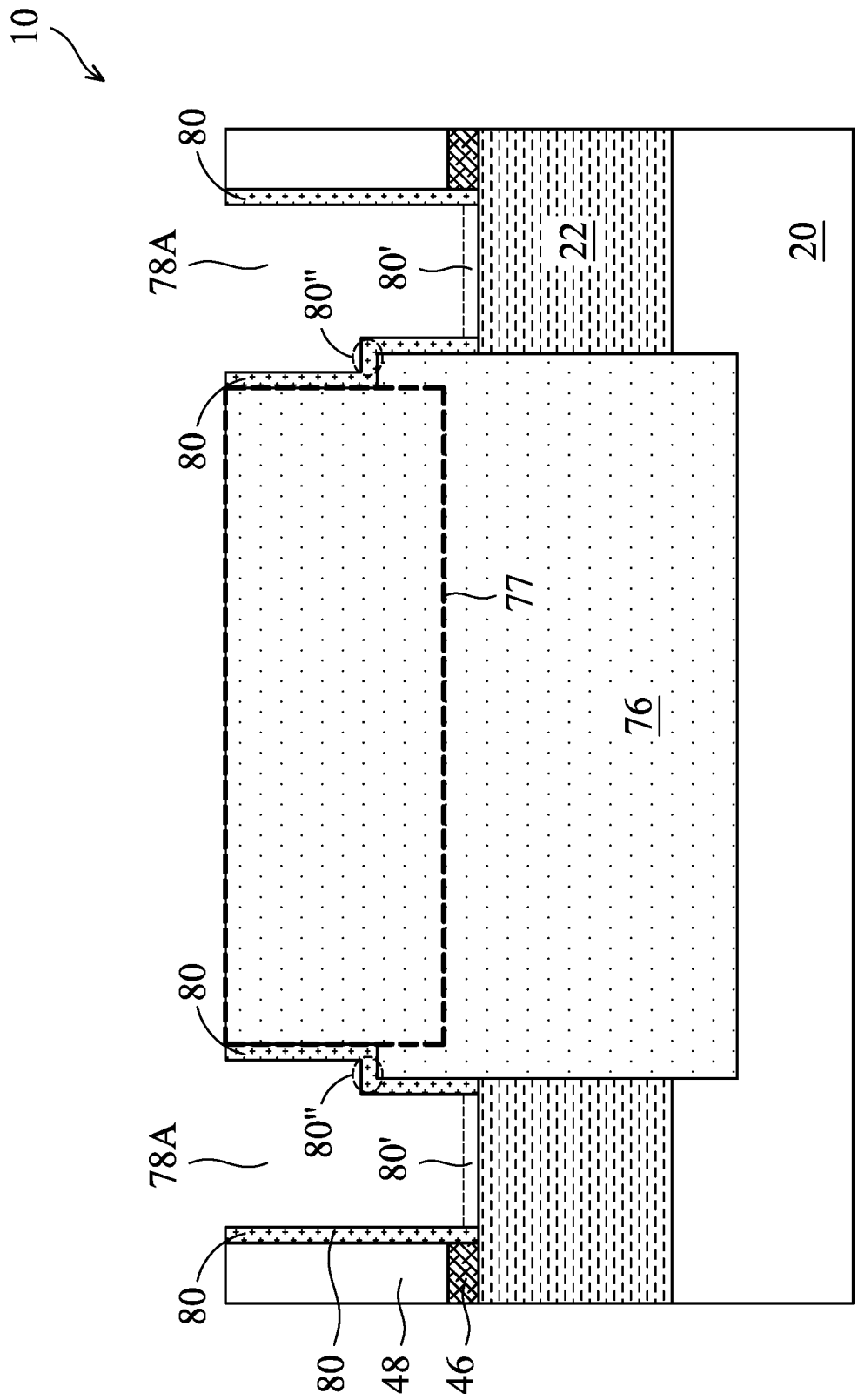

Referring to FIGS. 13A and 13B, dielectric spacers 80 are formed, for example, through a conformal deposition method such as CVD or ALD for form a conformal dielectric layer. FIG. 13A is obtained from the same plane in which FIG. 12B is obtained, and FIG. 13B is obtained from the same plane in which FIG. 12C is obtained. An anisotropic etching process is then performed to remove the portions 80' of the conformal dielectric layer at the bottoms of openings 78, so that source/drain regions 42 (FIG. 13A) are revealed again. Portions 80'' (FIG. 13B) may be thinned or removed. The respective process is illustrated as process 224 in the process flow as shown in FIG. 16. Dielectric spacers 80 may be formed of a material selected from $Al_xO_y$, $HfO_2$, SiN, $SiO_2$, SiOCN, combinations thereof, composite layers thereof, or the like. The thickness of dielectric layer 80 may be in the range between about 2 nm and about 4 nm.

Figure 14A:
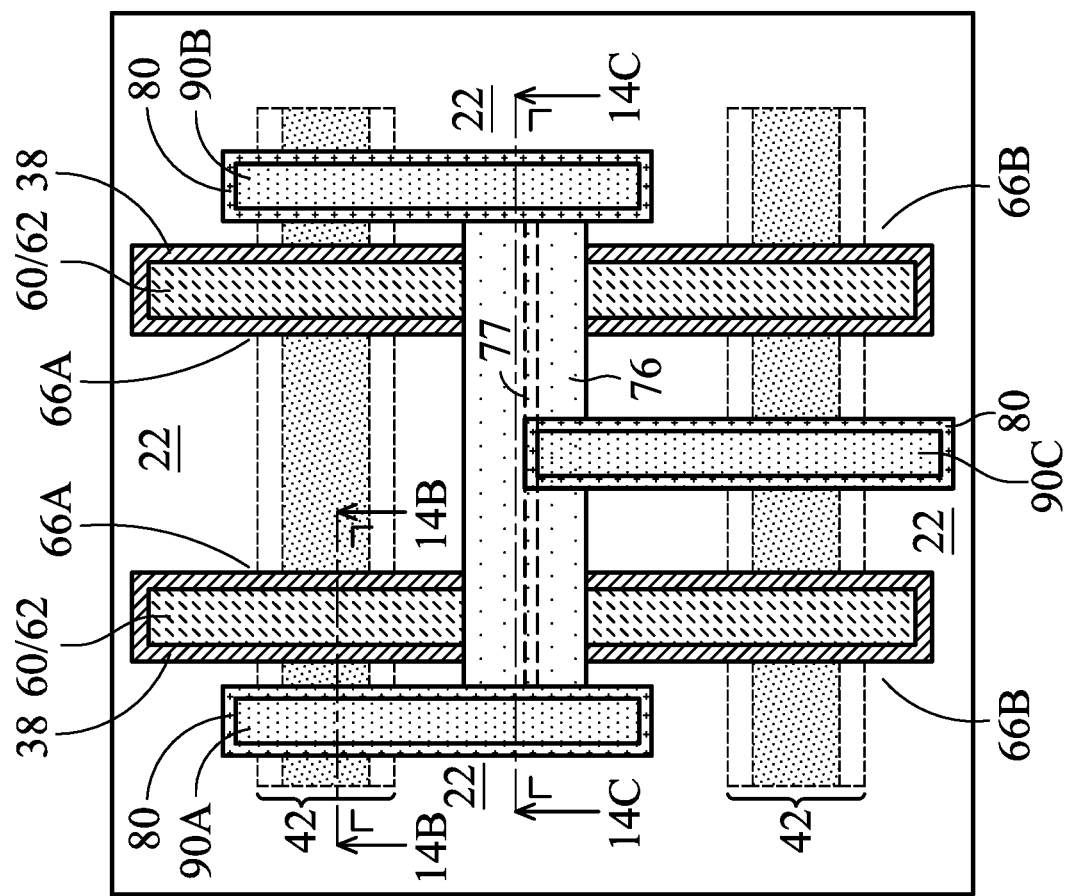

In the anisotropic etch, the horizontal portions of dielectric layer 80 are removed, and the remaining vertical portions on the sidewalls of opening 78 form contact spacer 80, which form full rings when viewed from the top of wafer 10 (refer to FIG. 14A).

As shown in FIG. 13B, contact spacer 80 is deposited on the sidewalls openings 78A and 78B, and grows on the sidewalls of openings 78A and 78B with the proceeding of the deposition. When void 77 exists, some portions of contact spacer 80 are grown on the end portions of void 77, and seals void 77 from sides. The material for forming contact spacer 80 may also fill void 77 partially from top if void 77 has opening at the top. Accordingly, contact spacer 80 separates the otherwise continuous opening/void 77/78 into isolated openings 78 and void 77 (if void 77 is not fully filled).

Figure 14B:
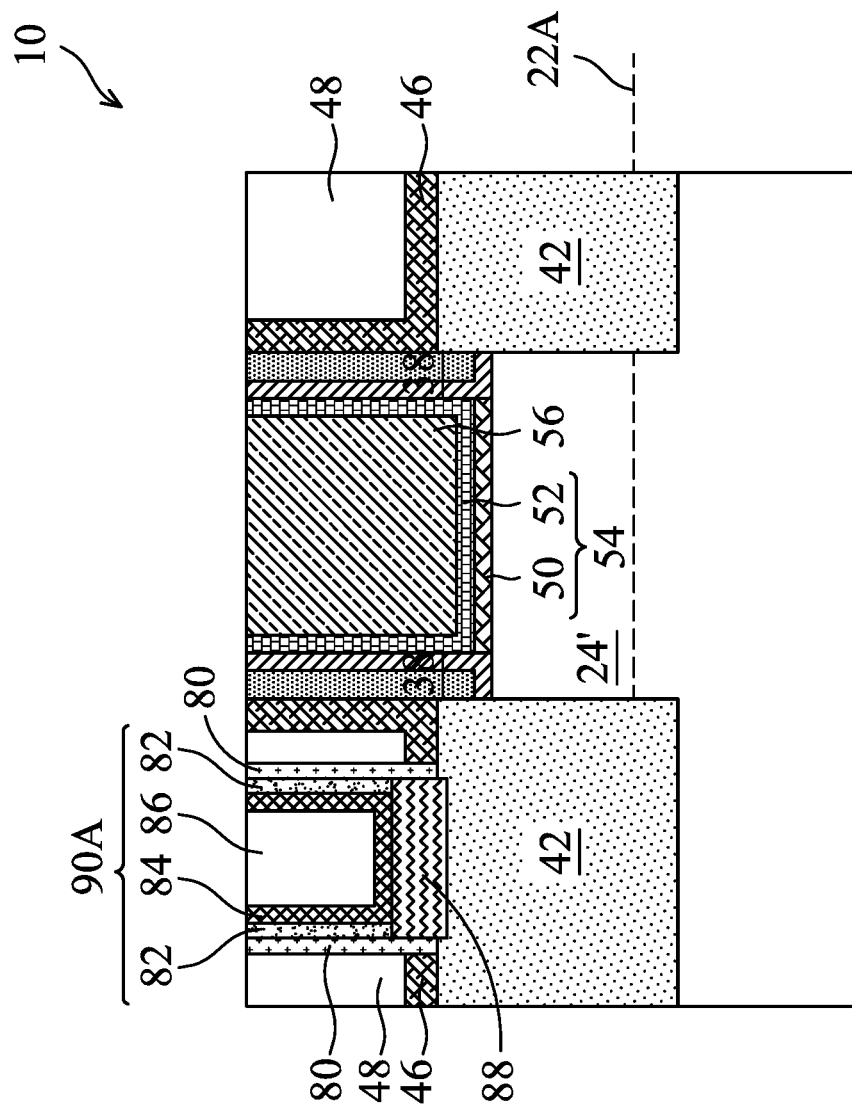
Figure 14C:
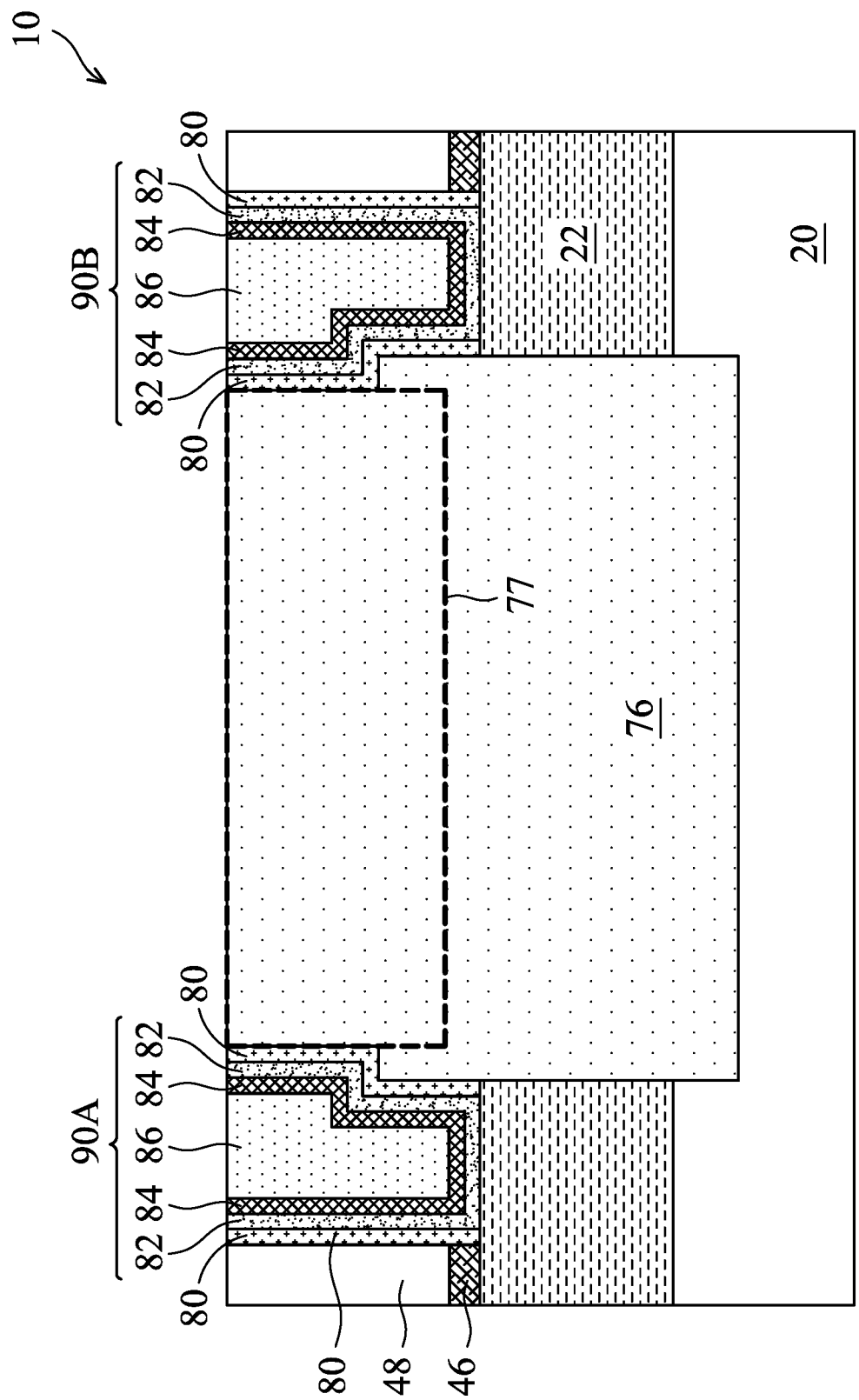

Referring to FIGS. 14B and 14C, metal layer 82 (such as a titanium layer or a cobalt layer) is deposited, for example, using PVD. Barrier layer 84, which may be a metal nitride layer such as a titanium nitride layer or a tantalum nitride layer is then formed over metal layer 82. Barrier layer 84 may be formed using CVD or through the nitridation of a top layer of metal layer 82. Layers 82 and 84 are both conformal, and extend into openings 78.

An anneal is then performed to form source/drain silicide region 88. The anneal may be performed through Rapid Thermal Anneal (RTA), furnace anneal, or the like. Accordingly, the bottom portion of metal layer 82 reacts with source/drain region 42 to form silicide region 88. The sidewall portions of metal layer 82 remain after the silicidation process. In accordance with some embodiments of the present disclosure, the top surface of silicide region 88 is in contact with the bottom surface of barrier layer 84.

Next, metallic material 86 is deposited over and in contact with barrier layer 84. Metallic material 86 may include tungsten, cobalt, or the like. A planarization process such as a CMP process or a mechanical grinding process is then performed to remove the portions of layers 82, 84, and 86 over ILD 48 to form source/drain contact plugs 90 (including 90A, 90B, and 90C). The respective process is illustrated as process 226 in the process flow as shown in FIG. 16. The resulting structure is shown in FIG. 14A, which includes source/drain contact plugs 90A, 90B, and 90C that are individually and collectively referred to as contact plugs 90.

FIGS. 14A and 14C illustrate contact plug 90 in a top view and a cross-sectional view, respectively. FIG. 14B is obtained from the plane containing line 14B-14B in FIG. 14A, and FIG. 14C is obtained from the plane containing line 14C-14C in FIG. 14A. As shown in FIG. 14A, even if void 77 exists, dielectric contact spacers 80 prevent contact plug 90A from being electrically shorted to contact plug 90B through the metal that is undesirable filled into void 77 in the formation of contact plugs 90. Also, as shown in FIG. 14A, when contact plug 90C encroaches into dielectric isolation region 76, dielectric contact spacers 80 prevent contact plug 90C from being electrically shorted to contact plugs 90A and 90B through the metal that is undesirable filled into void 77 in the formation of contact plugs 90.

Figure 15:
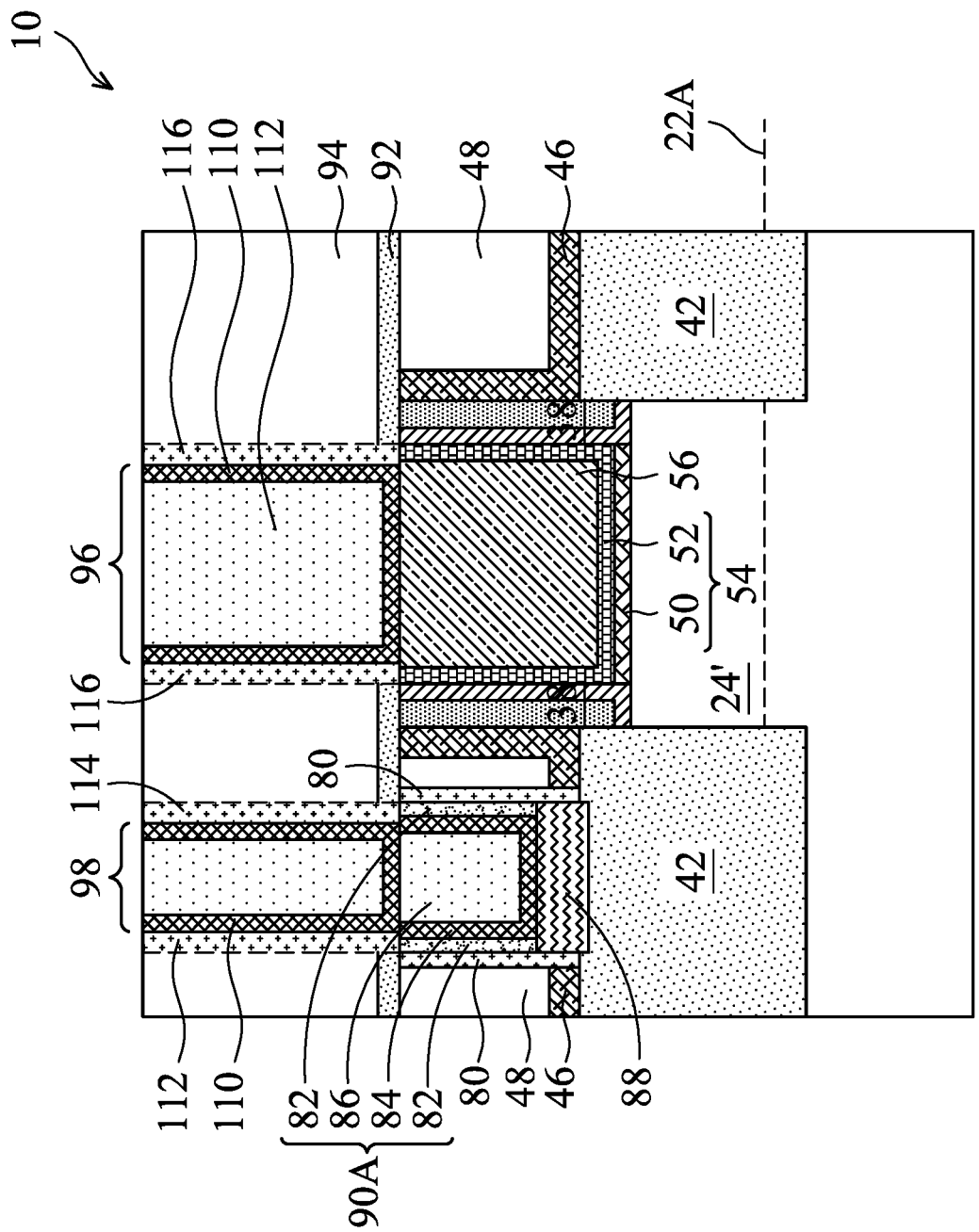
Figure 16:
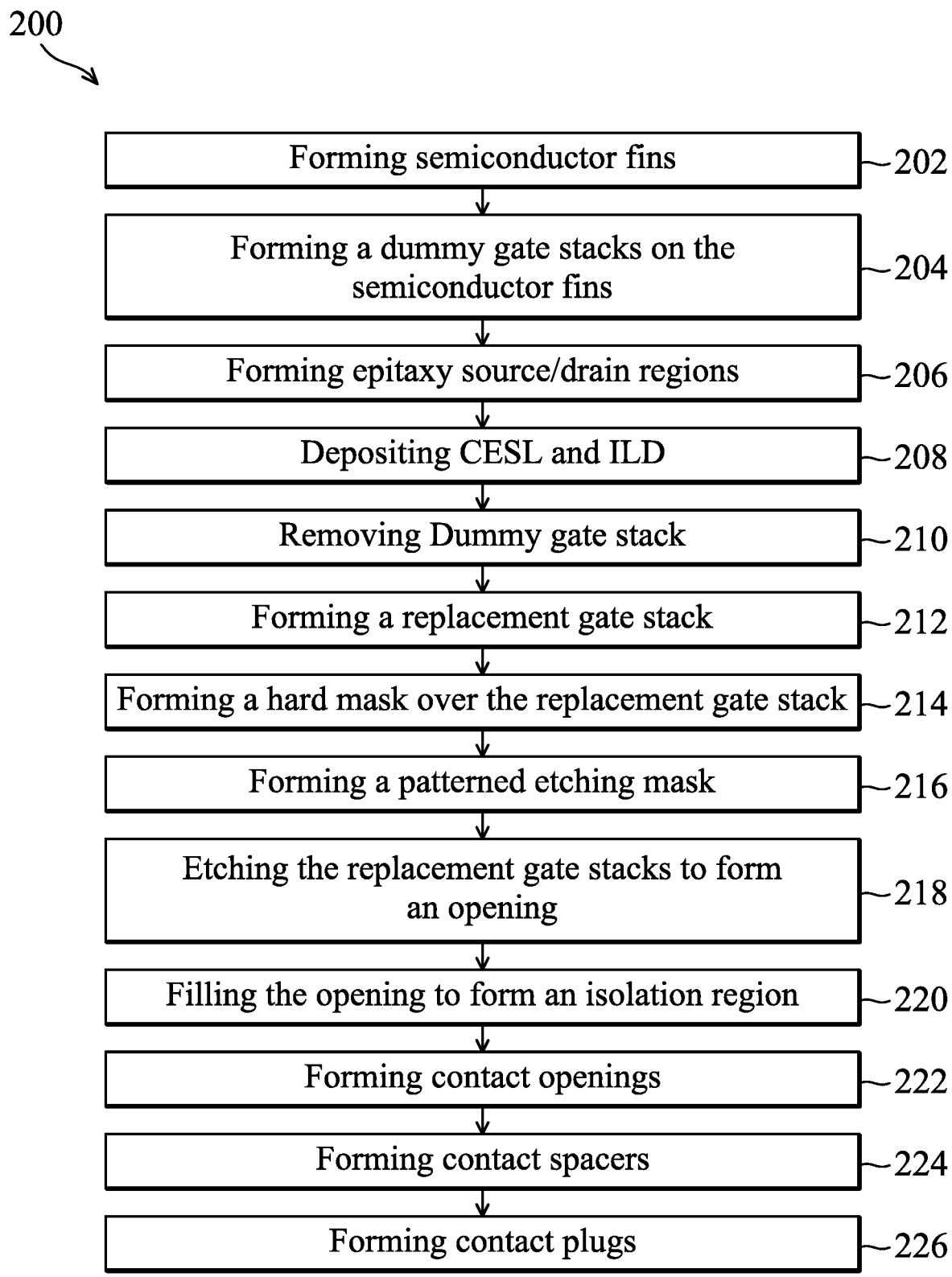
FIG. 16 illustrates a process flow for forming FinFETs in accordance with some embodiments.

FIG. 15 illustrates the formation of etch stop layer 92, dielectric layer 94, gate contact plug (via) 96, and source/drain contact plug (via) 98. Etch stop layer 92 may be formed of silicon carbide, silicon oxynitride, silicon carbonitride, or the like, and may be formed using a deposition method such as CVD. Dielectric layer 94 may include a material selected from PSG, BSG, BPSG, Fluorine-doped Silicon Glass (FSG), TEOS oxide, PECVD oxide ($SiO_2$), or the like. Dielectric layer 94 may be formed using spin coating, FCVD, or the like, or formed using a deposition method such as PECVD or Low-Pressure Chemical Vapor Deposition (LPCVD).

In the formation of contact plugs 96 and 98, dielectric layer 94 and etch stop layer 92 are first etched to form openings (occupied by plugs/vias 96 and 98). The etching may be performed using, for example, Reactive Ion Etch (RIE). In subsequent processes, plugs/vias 96 and 98 are formed. In accordance with some embodiments of the present disclosure, plugs/vias 96 and 98 include barrier layer 110 and metal-containing material 112 over barrier layer 110. In accordance with some embodiments of the present disclosure, the formation of plugs/vias 96 and 98 includes depositing a blanket barrier layer and a metal-containing material over the blanket barrier layer, and performing a planarization process to remove excess portions of the blanket barrier layer and the metal-containing material. Barrier layer 110 may be formed of a metal nitride such as titanium nitride or tantalum nitride. In accordance with some embodiments of the present disclosure, contact spacers 114 and 116 are formed, which may be formed of a material selected from the same group of candidate materials for forming contact spacers 80. In accordance with other embodiments, contact spacers 114 and 116 are not formed.

In accordance with some embodiments of the present disclosure, the example of the layout shown in FIG. 14A may be a part of a Static Random Access Memory (SRAM) cell, in which transistors 66B form pull-up transistors of a first SRAM cell, and transistors 66A form pass-gate transistors of a second SRAM cell. Contact plug 90C may be used to connect positive power supply voltage VCC to the source/drains of pull-up transistors 66B. It is realized that the embodiments of the present disclosure may be applied to other tightly spaced circuits other than SRAM cells.

The embodiments of the present disclosure have some advantageous features. By forming dielectric contact spacers to encircle contact plugs, the electrical shorting of contact plugs caused by the voids in cut-gate dielectric regions may be prevented.

In accordance with some embodiments of the present disclosure, a method includes forming a first and a second dummy gate stack crossing over a semiconductor region, forming an ILD to embed the first and the second dummy gate stacks therein, replacing the first and the second dummy gate stacks with a first and a second replacement gate stack, respectively, performing a first etching process to form a first opening. A portion of the first replacement gate stack and a portion of the second replacement gate stack are removed. The method further includes filling the first opening to form a dielectric isolation region, performing a second etching process to form a second opening, with the ILD being etched, and the dielectric isolation region being exposed to the second opening, forming a contact spacer in the second opening, and filling a contact plug in the second opening. The contact plug is between opposite portions of the contact spacer. In an embodiment, the first etching process further comprises etching a portion of the ILD between the first dummy gate stack and the second dummy gate stack. In an embodiment, the first etching process further comprises etching portions of an isolation region underlying the portion of the first dummy gate stack and the portion of the second dummy gate stack, wherein the isolation region extends into a semiconductor substrate underlying the semiconductor region. In an embodiment, the first etching process further comprises etching a portion of the semiconductor substrate. In an embodiment, after the second etching process, a void in the dielectric isolation region is connected to the second opening to form a continuous opening. In an embodiment, the contact spacer disconnects the void from the second opening. In an embodiment, the filling the contact plug comprises: depositing a metal layer comprising a portion extending into the second opening, wherein the portion of the metal layer is encircled by the contact spacer; reacting the metal layer with an underlying source/drain region to form a silicide region; and filling a metal region into the second opening. In an embodiment, in the second etching process, the dielectric isolation region is etched. In an embodiment, in the second etching process, the dielectric isolation region is etched with a lower etching rate than the ILD is etched.

In accordance with some embodiments of the present disclosure, a method includes forming an etching mask, wherein a portion of a first metal gate, gate spacers on opposite sides of the first metal gate, and an ILD on a side of the gate spacers are revealed through the etching mask; performing a first etching process to form a first opening in the ILD, wherein exposed portions of the first metal gate, the gate spacers, and the ILD are removed; filling the first opening with a dielectric isolation region; performing a second etching process to form a second opening in the ILD, wherein a source/drain region on a side of the first metal gate is revealed through the second opening; depositing a dielectric layer, wherein the dielectric layer extends into the second opening; and removing a bottom portion of the dielectric layer at a bottom of the second opening, with remaining portions of the dielectric layer on sidewalls of the second opening forming a contact spacer, and the contact spacer has a sidewall contacting a sidewall of the dielectric isolation region. In an embodiment, in the first etching process, a second metal gate adjacent to the first metal gate is further etched, and the first opening continuous extends from the first metal gate to the second metal gate. In an embodiment, in the second etching process, an isolation region underlying the first metal gate and the ILD are etched, and the second opening extends into a bulk semiconductor substrate underlying the isolation region. In an embodiment, in the second etching, a portion of the dielectric isolation region is etched to connect a void in the dielectric isolation region with the second opening. In an embodiment, the contact spacer separates the second opening from the void. In an embodiment, when the ILD is etched to form the second opening, a third opening is formed in the ILD, and a first end portion of the dielectric isolation region is exposed to the second opening, and an intermediate portion between the first end portion and a second end portion of the dielectric isolation region is exposed to the third opening.

In accordance with some embodiments of the present disclosure, a device includes a first metal gate; a dielectric isolation region separating the first metal gate into a first portion and a second portion; a source/drain region on a side of the first portion of the first metal gate and forms a first transistor with the first portion; an inter-layer dielectric embedding the first metal gate and the source/drain region therein; a contact plug extending into the inter-layer dielectric to electrically couple to the source/drain region; and a dielectric contact spacer comprising portions on opposite sides of, and contacting, the contact plug. In an embodiment, the dielectric contact spacer has a sidewall contacting a sidewall of the dielectric isolation region. In an embodiment, the dielectric contact spacer comprises a void, and the void extends to the dielectric contact spacer, with the sidewall of the dielectric contact spacer exposed to the void. In an embodiment, the device further includes a second metal gate, wherein the dielectric isolation region further separates the second metal gate into a third portion and a fourth portion. In an embodiment, in a top view of the device, the dielectric isolation region has a lengthwise direction perpendicular to a lengthwise direction of the first metal gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
a first metal gate;
a dielectric isolation region separating the first metal gate into a first portion and a second portion;
a source/drain region on a side of the first portion of the first metal gate, wherein the source/drain region and the first portion of the first metal gate forms a first transistor;
an inter-layer dielectric embedding the first metal gate therein;
a contact plug extending into the inter-layer dielectric to electrically couple to the source/drain region; and
a dielectric contact spacer comprising portions on opposite sides of, and contacting, the contact plug, wherein the dielectric contact spacer comprises first sidewalls contacting second sidewalls of the dielectric isolation region and third sidewalls of the contact plug.

2. The device of claim 1, wherein the dielectric isolation region comprises a void, and the void extends to the dielectric contact spacer, with one of the first sidewalls of the dielectric contact spacer exposed to the void.

3. The device of claim 1 further comprising a second metal gate, wherein the dielectric isolation region further separates the second metal gate into a third portion and a fourth portion.

4. The device of claim 1, wherein in a top view of the device, the dielectric isolation region has a first lengthwise direction perpendicular to a second lengthwise direction of the first metal gate.

5. The device of claim 1, wherein the dielectric contact spacer forms a ring encircling the contact plug.

6. The device of claim 1 further comprising:
an additional contact plug; and
an additional dielectric contact spacer encircling the additional contact plug, wherein the additional contact plug and the additional dielectric contact spacer extend into the dielectric isolation region, and a first lengthwise direction of the additional contact plug is perpendicular to a second lengthwise direction of the additional dielectric contact spacer.

7. The device of claim 1, wherein in a cross-sectional view of the device, the dielectric contact spacer forms an interface with the dielectric isolation region, and the interface comprises a step, with the step comprising a first vertical part and a second vertical part, and a horizontal part connecting the first vertical part to the second vertical part.

8. A device comprising:
a semiconductor substrate;
isolation regions extending into the semiconductor substrate;
a semiconductor strip between opposing portions of the isolation regions;
a semiconductor fin overlapping the semiconductor strip;
a gate stack on a top surface and sidewalls of the semiconductor fin;
a dielectric isolation region contacting the gate stack;
a source/drain region on a side of the gate stack;
a contact plug over and electrically coupling to the source/drain region;
an inter-layer dielectric over the source/drain region; and
a dielectric contact spacer in, and forming a distinguishable interface with, the inter-layer dielectric, wherein the dielectric contact spacer is between, and comprises:
a first sidewall contacting a second sidewall of the contact plug; and
a third sidewall contacting a fourth sidewall of the dielectric isolation region.

9. The device of claim 8, wherein the dielectric contact spacer encircles the contact plug.

10. The device of claim 8 further comprising:
a gate electrode in the gate stack; and
a gate spacer on a sidewall of the gate electrode, wherein the dielectric isolation region is in contact with both of the gate spacer and the gate electrode.

11. The device of claim 8, wherein the dielectric isolation region has a void therein, and a sidewall of the dielectric contact spacer is exposed to the void.

12. The device of claim 11, wherein the void extends from a top surface of the dielectric isolation region to an intermediate level between the top surface and a bottom surface of the dielectric isolation region.

13. The device of claim 11 further comprising:
an etch stop layer over and contacting the inter-layer dielectric and the dielectric contact spacer.

14. The device of claim 8, wherein the dielectric isolation region is elongated and having a first lengthwise direction, and the dielectric isolation region comprises:
a void having a second lengthwise direction parallel to the first lengthwise direction, wherein the dielectric contact spacer is exposed to the void.

15. A device comprising:
a first transistor comprising:
a first gate stack comprising a first gate dielectric and a first gate electrode over a first bottom portion of the first gate dielectric; and
a first source/drain region on a first side of the first gate stack;
a first contact plug over and electrically coupling to the first source/drain region;
a first contact spacer encircling the first contact plug;
a second transistor comprising:
a second gate stack comprising a second gate dielectric and a second gate electrode over a second bottom portion of the second gate dielectric; and
a second source/drain region on a second side of the second gate stack;
a second contact plug over and electrically coupling to the second source/drain region;
a second contact spacer encircling the second contact plug; and
a dielectric isolation region contacting at least one of the first gate dielectric and the first gate electrode, at least one of the second gate dielectric and the second gate electrode, the first contact spacer, and the second contact spacer.

16. The device of claim 15 further comprising an inter-layer dielectric, with the first gate stack, the second gate stack, the first contact spacer, and the second contact spacer being in the inter-layer dielectric.

17. The device of claim 16, wherein top surfaces of the inter-layer dielectric, the first gate stack, the second gate stack, the first contact spacer, and the second contact spacer are coplanar.

18. The device of claim 15, wherein the dielectric isolation region is in physical contact with both of the first gate dielectric and the first gate electrode.

19. The device of claim 15 further comprising a void in the dielectric isolation region, wherein a sidewall of the first contact spacer is exposed to the void.

20. The device of claim 15, wherein the dielectric isolation region has a first lengthwise direction perpendicular to second lengthwise directions of the first gate stack and the second gate stack.

* * * * *